(12) United States Patent
Sakamoto

(10) Patent No.: US 10,541,247 B2
(45) Date of Patent: Jan. 21, 2020

(54) SEMICONDUCTOR DEVICE

(71) Applicant: Toshiba Memory Corporation, Minato-ku (JP)

(72) Inventor: Wataru Sakamoto, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/049,151

(22) Filed: Jul. 30, 2018

(65) Prior Publication Data

US 2018/0350828 A1   Dec. 6, 2018

Related U.S. Application Data

(63) Continuation of application No. 15/460,536, filed on Mar. 16, 2017, now Pat. No. 10,068,911.

(60) Provisional application No. 62/376,740, filed on Aug. 18, 2016.

(51) Int. Cl.
| | |
|---|---|
| *H01L 27/11556* | (2017.01) |
| *H01L 27/11519* | (2017.01) |
| *H01L 29/10* | (2006.01) |
| *H01L 27/11565* | (2017.01) |
| *H01L 27/11582* | (2017.01) |
| *H01L 21/28* | (2006.01) |

(52) U.S. Cl.
CPC .. *H01L 27/11556* (2013.01); *H01L 27/11519* (2013.01); *H01L 27/11565* (2013.01); *H01L 27/11582* (2013.01); *H01L 29/1037* (2013.01); *H01L 29/40114* (2019.08); *H01L 29/40117* (2019.08)

(58) Field of Classification Search
CPC ......... H01L 27/11556; H01L 27/11519; H01L 27/11524
See application file for complete search history.

(56) References Cited

U.S. PATENT DOCUMENTS

| | | |
|---|---|---|
| 9,716,105 B1 | 7/2017 | Tsutsumi |
| 2007/0252201 A1 | 11/2007 | Kito et al. |
| 2010/0019310 A1* | 1/2010 | Sakamoto ......... H01L 27/11578 257/324 |

(Continued)

FOREIGN PATENT DOCUMENTS

JP    2010-157734    7/2010

*Primary Examiner* — Walter H Swanson
(74) *Attorney, Agent, or Firm* — Oblon, McClelland, Maier & Neustadt, L.L.P.

(57) ABSTRACT

According to one embodiment, a semiconductor device includes a stacked body, a columnar portion, a first charge storage portion, and a second charge storage portion. The stacked body includes a plurality of electrode layers stacked in a first direction. The plurality of electrode layers includes a first electrode layer, and a second electrode layer. The columnar portion extends in the first direction in the stacked body. The first charge storage portion provides between the first electrode layer and the columnar portion. The second charge storage portion provides between the second electrode layer and the columnar portion. A first thickness in a second direction intersecting the first direction of the first charge storage portion between the first electrode layer and the columnar portion is thicker than a second thickness in the second direction of the second charge storage portion between the second electrode layer and the columnar portion.

20 Claims, 18 Drawing Sheets

(56) References Cited

U.S. PATENT DOCUMENTS

| | | |
|---|---|---|
| 2010/0163968 A1 | 7/2010 | Kim et al. |
| 2013/0009229 A1 | 1/2013 | Lee |
| 2014/0264527 A1* | 9/2014 | Koval ............... H01L 29/66666 |
| | | 257/315 |
| 2015/0318298 A1* | 11/2015 | Matsudaira ......... H01L 27/1157 |
| | | 257/314 |
| 2016/0055911 A1* | 2/2016 | Nguyen ................. G11C 16/10 |
| | | 365/185.17 |
| 2016/0190313 A1 | 6/2016 | Koval et al. |
| 2016/0300849 A1 | 10/2016 | Chan |
| 2017/0076807 A1 | 3/2017 | Asami |

\* cited by examiner

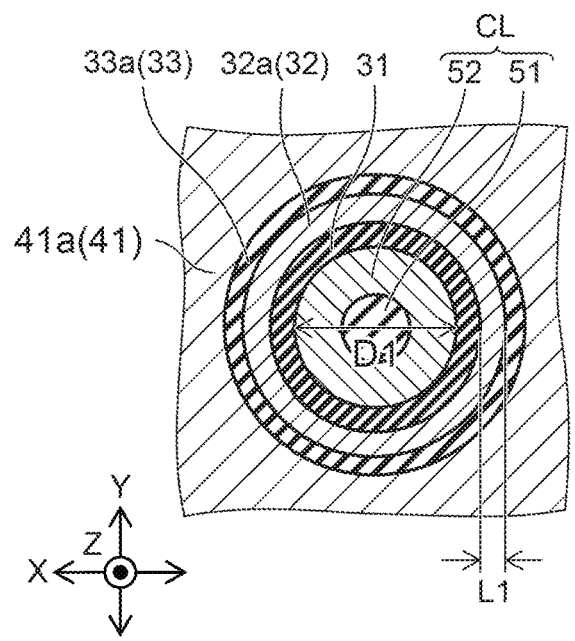
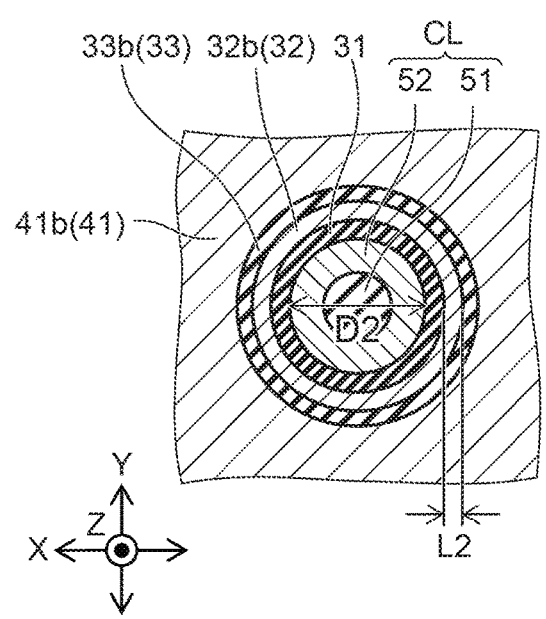
FIG. 3  FIG. 4
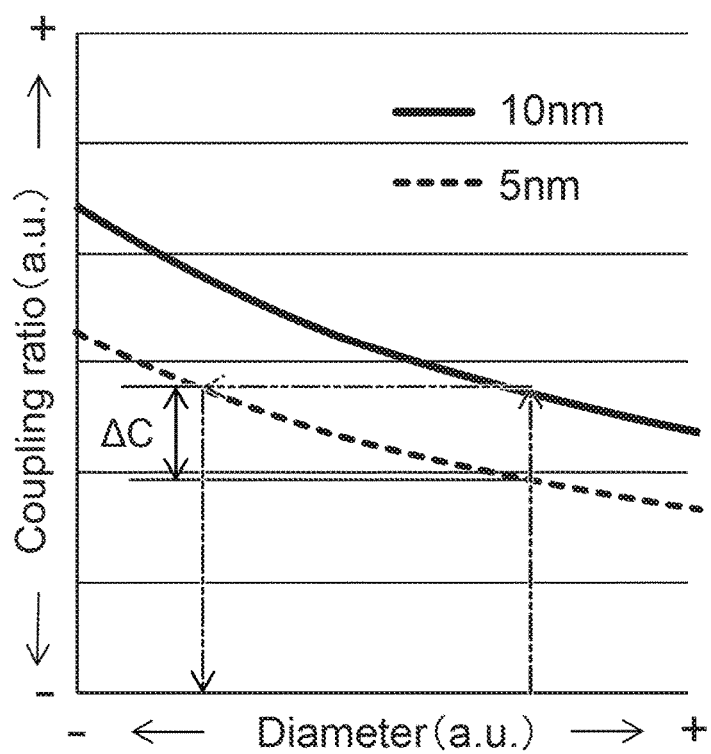
FIG. 5

ND DEVICE

CROSS-REFERENCE TO RELATED APPLICATIONS

This application is a continuation application of and claims the benefit of priority under 35 U.S.C. § 120 from U.S. application Ser. No. 15/460,536, filed on Mar. 16, 2017, which is based upon and claims the benefit of priority from U.S. Provisional Patent Application No. 62/376,740, filed on Aug. 18, 2016, the entire contents of each of which are incorporated herein by reference.

FIELD

Embodiments described herein relate generally to a semiconductor device.

BACKGROUND

A semiconductor memory device having a three-dimensional structure has been proposed in which a memory hole is formed in a stacked body including a plurality of electrode layers stacked thereon, a columnar portion is provided in the memory hole, a plurality of charge storage portions are respectively provided between the plurality of electrode layers and the columnar portion in a stacking direction of the stacked body. In order to increase the capacity of the semiconductor memory device, it is desired to increase the number of stacked electrode layers. Increasing the number of stacked electrode layers makes it difficult to form a memory hole having a uniform diameter in the stacking direction. Variations in the diameter of the memory hole in the stacking direction can lead to variations in the coupling ratio between the electrode layer and the channel.

BRIEF DESCRIPTION OF THE DRAWINGS

FIG. 3 is a schematic sectional view taken along line III-III in FIG. 2;

FIG. 4 is a schematic sectional view taken along line IV-IV in FIG. 2;

FIG. 5 is a graph illustrating the relationship between the diameter of the columnar portion and the coupling ratio;

DETAILED DESCRIPTION

Figure 1:
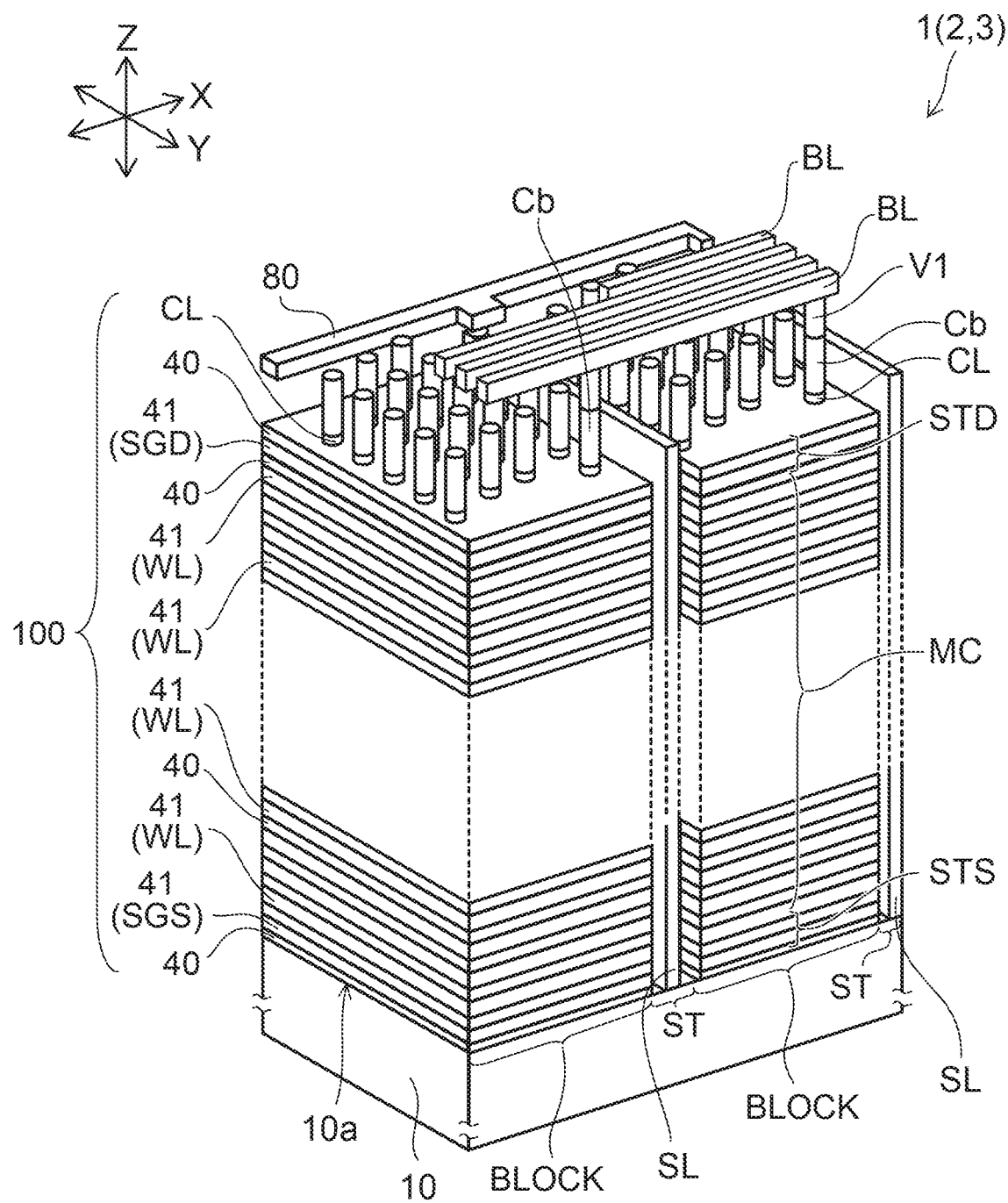
FIG. 1 is a schematic perspective view of a memory cell array of a semiconductor device of a first embodiment.

According to one embodiment, a semiconductor device includes a stacked body, a columnar portion, a first charge storage portion, and a second charge storage portion. The stacked body includes a plurality of electrode layers stacked on a substrate in a first direction with an insulator interposed between the electrode layers. The plurality of electrode layers includes a first electrode layer, and a second electrode layer provided between the first electrode layer and the substrate. The columnar portion extends in the first direction in the stacked body. The first charge storage portion provides between the first electrode layer and the columnar portion. The second charge storage portion provides between the second electrode layer and the columnar portion. A first thickness in a second direction intersecting the first direction of the first charge storage portion between the first electrode layer and the columnar portion is thicker than a second thickness in the second direction of the second charge storage portion between the second electrode layer and the columnar portion.

Hereinafter, embodiments will be described with reference to the drawings. The same reference numerals are attached to the same elements in each drawing. The semiconductor device of the embodiment is a semiconductor memory device including a memory cell array.

First Embodiment

Semiconductor Device

FIG. 1 is a schematic perspective view of a memory cell array of a semiconductor device of a first embodiment.

As shown in FIG. 1, in the semiconductor device of the first embodiment, two directions which are parallel to a major surface 10a of a substrate 10 and orthogonal to each other are an X-direction and a Y-direction, and a direction which is orthogonal to these X-direction and Y-direction is a Z-direction. For example, the Z-direction corresponds to a first direction, the X-direction corresponds to a second direction, and the Y-direction corresponds to a third direction.

A memory cell array 1 of the semiconductor device of the first embodiment includes a stacked body 100 including a plurality of electrode layers 41, a plurality of columnar portions CL, and a plurality of separating portions ST. The plurality of electrode layers 41 are stacked on the major surface 10a of the substrate 10 so as to be separated from each other. The number of plurality of stacked electrode layers 41 is arbitrary. For example, each of the plurality of electrode layers 41 includes doped silicon. The doped silicon includes, for example, one or more materials selected from the group consisted of phosphorus, arsenic, and boron.

For example, the higher the impurity concentrations of the plurality of electrode layers 41, the farther from the substrate 10 the electrode layers 41 are. For example, the impurity concentration of the electrode layer 41 closest to the substrate 10 is about $1 \times 10^{20}$ cm$^{-3}$, and the impurity concentration of the electrode layer 41 farthest from the substrate 10 is about $3 \times 10^{20}$ cm$^{-3}$.

For example, each of the plurality of electrode layers 41 may include metal such as tungsten or molybdenum.

An insulator 40 is disposed among a plurality of electrode layers 41. The insulator 40 may be, for example, an insulating material such as a silicon oxide film, or may be an air gap.

A plurality of electrode layers 41 include a drain-side select gate electrode SGD, a plurality of word lines WL, and a source-side select gate electrode SGS.

For example, the source-side select gate electrode SGS is provided on the substrate 10. For example, the plurality of word lines WL are provided on the source-side select gate electrode SGS. For example, the drain-side select gate electrode SGD is provided on the plurality of word lines WL.

The drain-side select gate electrode SGD functions as a gate electrode of the drain-side select transistor STD. The source-side select gate electrode SGS functions as a gate electrode of the source-side select transistor STS. A plurality of memory cells MC are connected in series between the drain-side select transistor STD and the source-side select transistor STS. One word line WL functions as a gate electrode of one memory cell MC.

The stacked body 100 includes a plurality of separating portions ST. The separating portions ST extend inside the stacked body 100 in the Z-direction and the Y-direction. The separating portion ST separates the stacked body 100 in the X-direction. The region separated by the separating portion ST is called "block". The block is, for example, a minimum unit of information erase. The erase size is set for one block or a plurality of blocks which are combined.

A source layer SL is provided in the separating portion ST. The source layer SL is insulated from the stacked body 100, and spreads like a plate, for example, in the Z-direction and the Y-direction. An upper layer wiring 80 is provided above the source layer SL. The upper layer wiring 80 extends in the X-direction. The upper layer wiring 80 is electrically connected to a plurality of source layers SL which are arranged in the X-direction.

A plurality of columnar portions CL are provided in the stacked body 100 separated by the separating portion ST. The columnar portions CL extend in the stacked body 100 in the Z-direction.

The columnar portions CL are disposed in the form of, for example, a houndstooth pattern or a square lattice pattern, in the memory cell array 1.

A plurality of bit lines BL are provided above the upper end portion of the columnar portions CL. The plurality of bit lines BL extend in the X-direction. The upper end portion of the columnar portions CL are electrically connected to one of the bit lines BL through the contact portion Cb and the contact portion V1.

Figure 2:
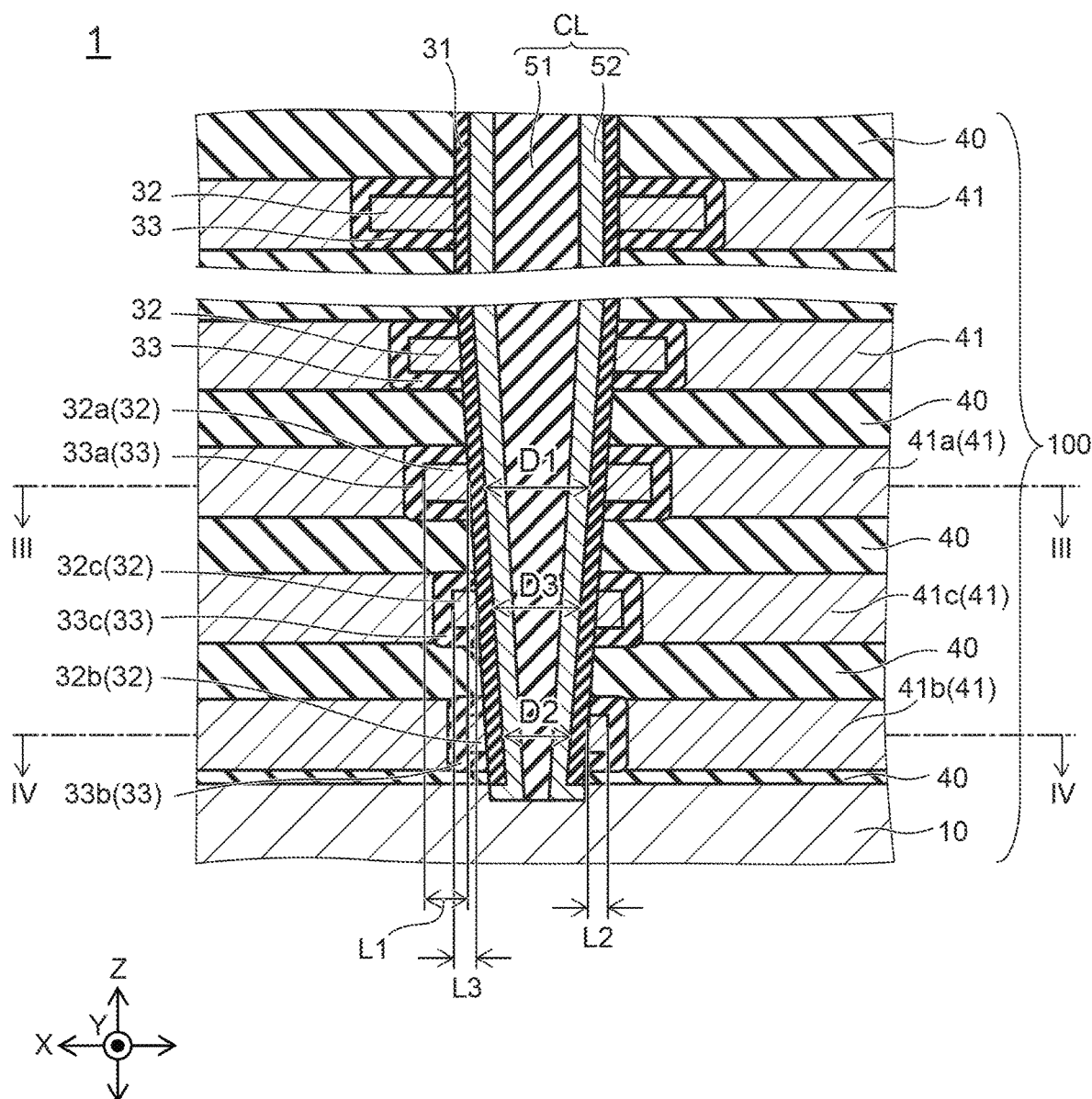
FIG. 2 is a schematic sectional view of the memory cell array of the semiconductor device of the first embodiment.

FIG. 2 is a schematic sectional view of the memory cell array of the semiconductor device of the first embodiment. FIG. 2 corresponds to a part of the cross section parallel to the XZ plane in FIG. 1. FIG. 2 is a schematic sectional view obtained by extracting the columnar portion CL and its surrounding portion. FIG. 3 is a schematic sectional view taken along line III-III in FIG. 2. FIG. 4 is a schematic sectional view taken along line IV-IV in FIG. 2.

As shown in FIG. 2, a plurality of electrode layers 41 include, for example, a first electrode layer 41a, a second electrode layer 41b, and a third electrode layer 41c. The second electrode layer 41b is disposed between the first electrode layer 41a and the substrate 10. The third electrode layer 41c is disposed between the first electrode layer 41a and the second electrode layer 41b.

As shown in FIGS. 2 to 4, the columnar portion CL extends in the stacked body 100 in the Z-direction and is electrically connected to the substrate 10. For example, the columnar portion CL has a substantially columnar shape. For example, the columnar portion CL has a tapered shape. In other words, the smaller the diameter of the columnar portion CL, the closer to the substrate 10 the columnar portion CL is.

The columnar portion CL includes a core portion 51 and a semiconductor body 52. The core portion 51 extends in the stacked body 100 in the Z-direction. The semiconductor body 52 is provided between the core portion 51 and the stacked body 100 and between the core portion 51 and the substrate 10.

A plurality of charge storage portions 32 are provided between the columnar portions CL and the plurality of electrode layers 41. For example, the charge storage portions 32 are floating gates or charge trapping layers. An insulator 40 is disposed among the plurality of charge storage portions 32. The respective charge storage portions 32 are spaced apart in the Z-direction by the insulator 40. For example, the smaller the thickness of the charge storage portion 32 between the columnar portion CL and the electrode layer 41, the closer to the substrate 10 the charge storage portion 32 is.

In the specification, the thickness of the charge storage portion 32 is the thickness of the charge storage portion 32 in the direction in the X-direction between the columnar portion CL and the electrode layer 41.

The plurality of charge storage portions 32 include for example, a first charge storage portion 32a, a second charge storage portion 32b, and a third charge storage portion 32c. For example, the first charge storage portion 32a is disposed between the columnar portion CL and the first electrode layer 41a. For example, the second charge storage portion 32b is disposed between the columnar portion CL and the second electrode layer 41b. For example, the third charge storage portion 32c is disposed between the columnar portion CL and the third electrode layer 41c.

For example, the thickness L1 of the first charge storage portion 32a in the X-direction between the columnar portion CL and the first electrode layer 41a is thicker than the thickness L2 of the second charge storage portion 32b in the X-direction between the columnar portion CL and the second electrode layer 41b.

For example, the thickness L3 of the third charge storage portion 32c in the X-direction between the columnar portion CL and the third electrode layer 41c is a thickness not more than the thickness L1. For example, the thickness L3 is a thickness not less than the thickness L2.

A tunnel insulating film 31 is provided between the columnar portion CL and each charge storage portion 32 and between the columnar portion CL and the insulator 40. For example, the tunnel insulating film 31 is cylindrical. For example, the smaller the inner diameter of the tunnel insulating film 31, the closer to the substrate 10 the tunnel insulating film 31 is.

For example, the inner diameter D1 of the tunnel insulating film 31 between the columnar portion CL and the first charge storage portion 32a is larger than the inner diameter D2 of the tunnel insulating film 31 between the columnar portion CL and the second charge storage portion 32b.

For example, the size of the inner diameter D3 of the tunnel insulating film 31 between the columnar portion CL and the third charge storage portion 32c is not more than the size of the inner diameter D1. The size of the inner diameter D3 is not less than the size of the inner diameter D2.

A block insulating film 33 is provided between the charge storage portion 32 and the electrode layer 41. For example, a plurality of block insulating films 33 are provided for respective electrode layers 41.

Examples of the plurality of block insulating films 33 include a first block insulating film 33a, a second block insulating film 33b, and a third block insulating film 33c. The first block insulating film 33a is disposed between the first charge storage portion 32a and the first electrode layer 41a. The second block insulating film 33b is disposed between the second charge storage portion 32b and the second electrode layer 41b. The third block insulating film 33c is disposed between the third charge storage portion 32c and the third electrode layer 41c.

The charge storage portion 32 includes for example, silicon. In a case of a floating gate, the charge storage portion 32 stores charges. In a case of a charge trapping layer, the charge storage portion 32 has a trapping site for trapping charges and traps charges. The threshold of the memory cell MC varies depending on the amount of charge present in the charge storage portion. Thus, the memory cell MC stores information. The tunnel insulating film 31 includes for example, silicon oxide. The tunnel insulating film 31 is a potential barrier between the charge storage portion 32 and the semiconductor body 52. The tunnel insulating film 31 tunnels charges when charges are injected into the charge storage portion 32 from the semiconductor body 52 (write operation), and when charges are diffused from the charge storage portion 32 to the semiconductor body 52 (erase operation). The block insulating film 33 may contain for example, aluminum oxide, may contain silicon oxide, or may be a stacked film thereof. The block insulating film 33 suppresses tunneling from the charge storage portion 32 to the word line during the write operation, and suppresses back tunneling of charges from the word line WL to the charge storage portion 32 during the erase operation.

Assuming that the capacitance of the block insulating film 33 is $C_{IPD}$ and the capacitance of the tunnel insulating film 31 is $C_{ox}$, when the voltage (write voltage) applied to the word line WL during the write operation is $V_{PGM}$, the voltage $V_{TNL}$ applied to the tunnel insulating film during the write operation can be represented by, for example, $$V_{TNL}=(C_{IPD}/(C_{IPD}+C_{ox}))\times V_{PGM} \qquad (1).$$

In Equation (1), $C_{IPD}/(C_{IPD}+C_{ox})$ is called "coupling ratio".

FIG. 5 is a graph illustrating the relationship between the diameter of the columnar portion and the coupling ratio. FIG. 5 is a graph showing the diameter of the columnar portion CL on the horizontal axis and the coupling ratio on the vertical axis. The solid line shows data when the thickness of each charge storage portion 32 between the columnar portion CL and the electrode layer 41 is 10 nm. The broken line shows data when the thickness of each charge storage portion 32 between the columnar portion CL and the electrode layer 41 is 5 nm.

For example, a configuration in which the columnar portion CL has a tapered shape and the thickness of each charge storage portion 32 between the columnar portion CL and the electrode layer 41 is constant may be considered. In this case, as the diameter of the columnar portion CL decreases, a difference between the inner diameter of the block insulating film 33 and the inner diameter of the tunnel insulating film 31 increases. For example, variations in the difference between the circumferential length of the block insulating film 33 and the circumferential length of the tunnel insulating film 31 are increased between the upper and lower layers of the memory cell array. Therefore, the coupling ratio of the corresponding region changes depending on the diameter of the columnar portion CL. As shown in FIG. 5, as the diameter of the columnar portion CL decreases, the coupling ratio of the corresponding region increases. For example, a difference ΔC in coupling ratios occurs between a region where the diameter of the columnar portion CL is small and a region where the diameter of the columnar portion CL is large. This results in that variations in the coupling ratio occur between the upper and lower layers of the memory cell array. This results in that variations in the writing speed occur between the upper and lower layers of the memory cell array. During a read operation, read disturb is remarkable.

As shown in FIG. 5, the coupling ratio in the region where the columnar portion CL is large when the thickness of the charge storage portion 32 is 10 nm shows approximately the same value as the coupling ratio in the region where the columnar portion CL is small when the thickness of the charge storage portion 32 is 5 nm. In the first example, the thickness of the charge storage portion 32 in the region where the diameter of the columnar portion CL is small is shorter than the thickness of the charge storage portion 32 in the region where the diameter of the columnar portion CL is large. With such a configuration, the difference ΔC in coupling ratios between the upper and lower layers of the memory cell can be reduced.

For example, as the diameter of the columnar portion CL decreases, the ratio between the inner diameter of the block insulating film 33 and the inner diameter of the tunnel insulating film 31 is suppressed from increasing. Therefore, the variation in the ratio between the circumferential length of the block insulating film 33 and the circumferential length of the tunnel insulating film 31 is suppressed between the upper and lower layers of the memory cell array. Thus, variations in the coupling ratio between the upper and lower layers of the memory cell array are suppressed. For example, variations in writing speed between the upper and lower layers of the memory cell array can be suppressed. In addition, read disturb and write disturb can be suppressed.

In the first embodiment, in a case where each electrode layer 41 contains doped silicon, the higher the impurity concentration of the electrode layer 41, the farther from the substrate 10 the electrode layer 41 is. Thus, the lower the resistivity of the electrode layer 41, the farther from the substrate 10 the electrode layer 41 is. For example, it is possible to correct the signal propagation delay of the word line caused by the difference in word line resistance, due to a difference between the memory hole diameters of the upper and lower layers of the memory cell array, by controlling the resistivity of the electrode layer 41.

Manufacturing Method

FIGS. 6 to 13 are schematic sectional views showing a manufacturing method of the semiconductor device of the first embodiment. FIGS. 6 to 13 correspond to the cross section shown in FIG. 2.

Figure 6:
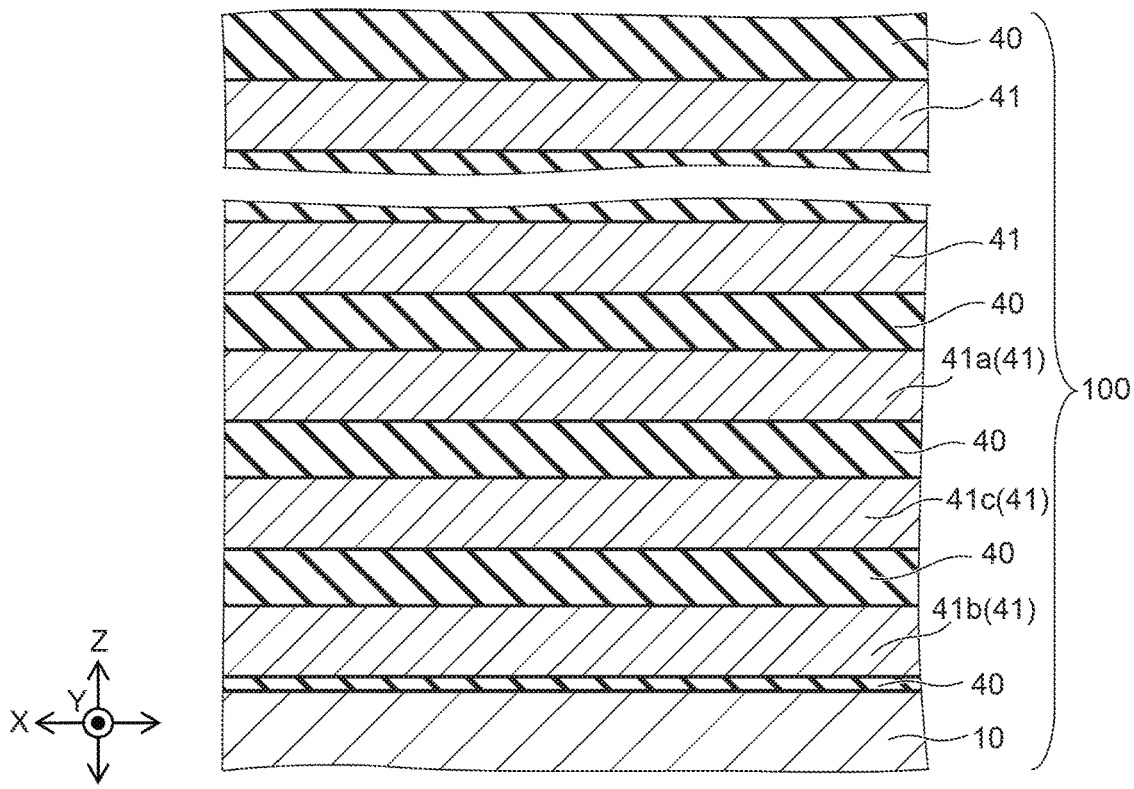
FIGS. 6 to 13 are schematic sectional views showing a manufacturing method of the semiconductor device of the first embodiment.

As shown in FIG. 6, the insulator 40 which is a first layer and the electrode layer 41 which is a second layer are alternately stacked on the substrate 10. Thus, the stacked body 100 including the electrode layer 41 stacked on the substrate 10 with the insulator 40 interposed therebetween is formed. The insulator 40 is formed of, for example, a material containing silicon oxide. For example, the electrode layer 41 is formed of a material containing doped silicon. The doped silicon includes, for example, one or more materials selected from the group consisted of phosphorus, arsenic, and boron. For example, the higher the impurity concentration of the electrode layer 41, the farther from the substrate 10 the electrode layer 41 is. For example, the electrode layer 41 may be formed of a material containing metal such as tungsten.

Figure 7:
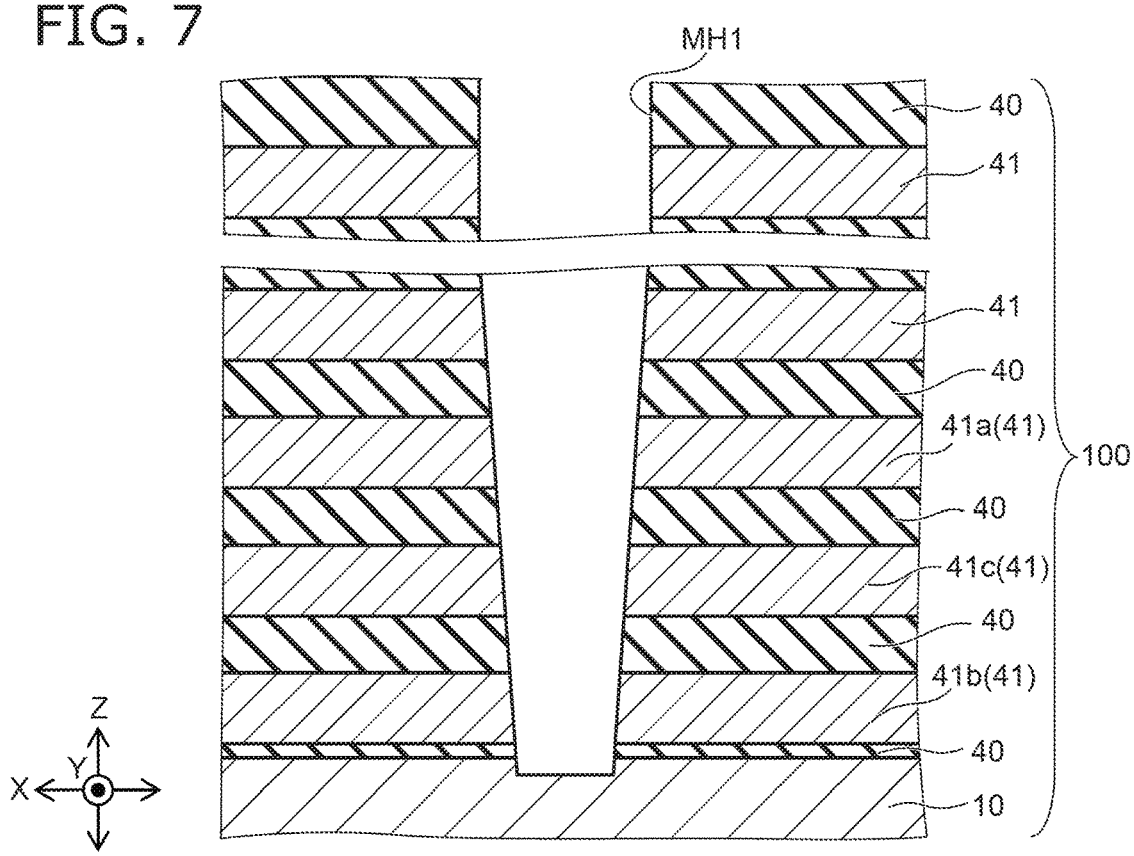

As shown in FIG. 7, for example, a memory hole MH1 is formed in the stacked body 100 by a photolithography method. The memory hole MH1 extends in the Z-direction in the stacked body 100. The memory hole MH1 penetrates the stacked body 100 and reaches the upper surface of the substrate 10. For example, the memory hole MH1 has a tapered shape. For example, the smaller the diameter of the memory hole MH1, the closer to the substrate 10 the memory hole MH1 is.

Figure 8:
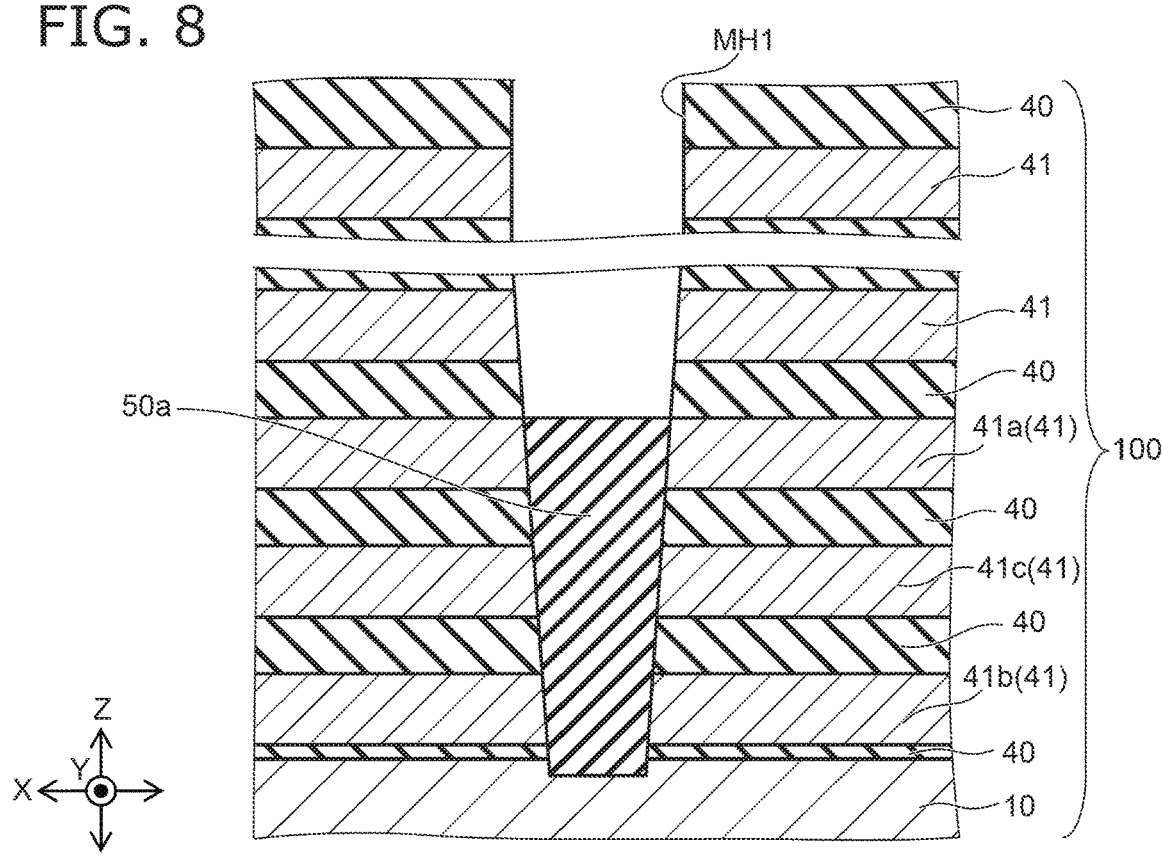

As shown in FIG. 8, a sacrificial member 50a is formed in the memory hole MH1. For example, the sacrificial member 50a is formed at the lower part of the memory hole MH1.

Figure 9:
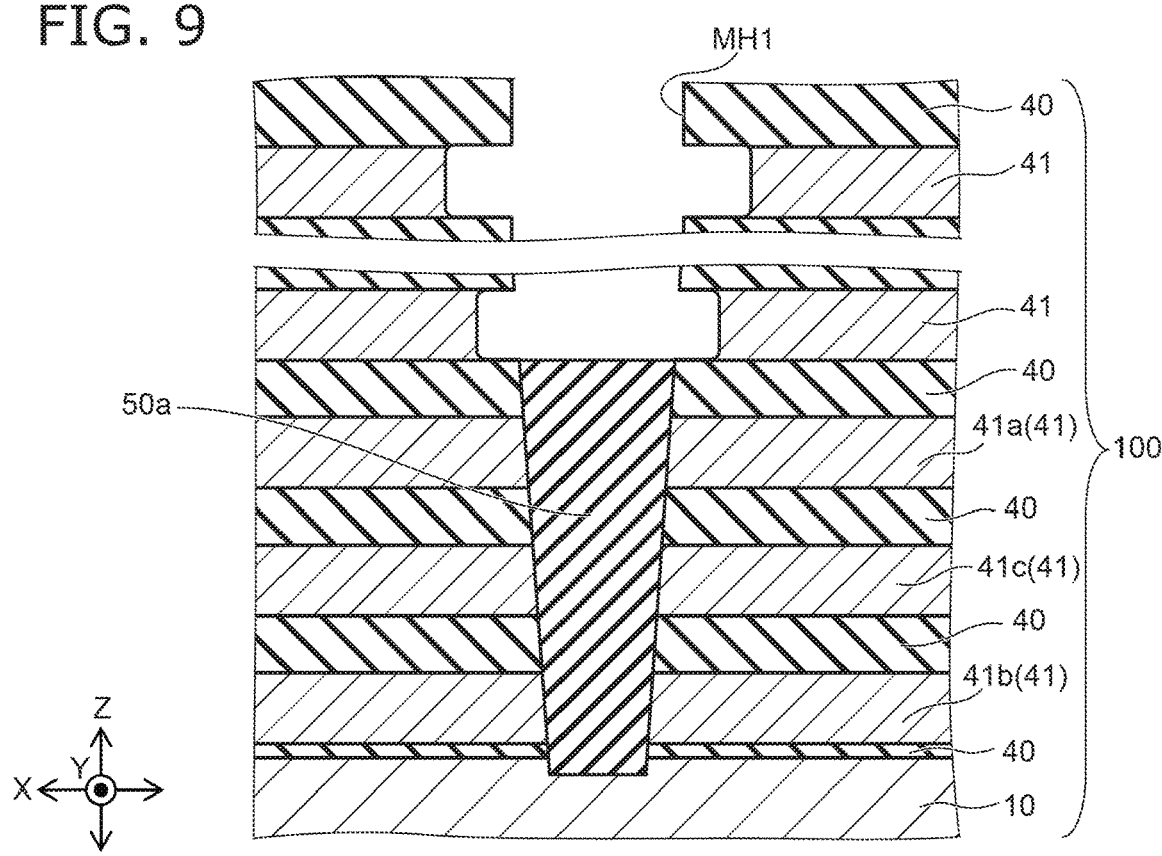

As shown in FIG. 9, an etching process is performed on the end face of the electrode layer 41 exposed in the memory hole MH1. For example, an etchant is supplied into the memory hole MH1. Thus, the end face of the electrode layer 41 exposed in the memory hole MH1 retreats. At this time, the lower part of the memory hole MH1 is filled with the sacrificial member 50a. Therefore, the electrode layer 41 in the lower part of the memory hole MH1 is not etched.

Figure 10:
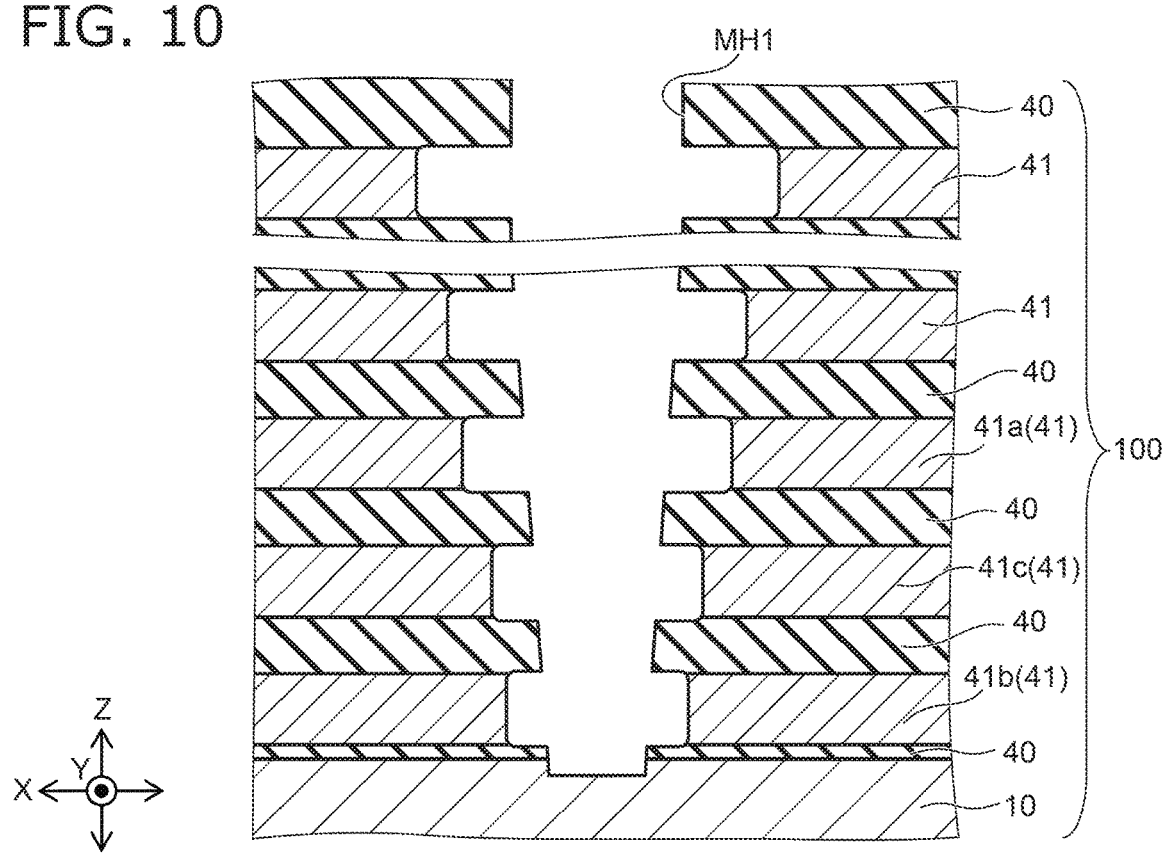

As shown in FIG. 10, the sacrificial member 50a is removed by an etching process such as chemical dry etching or wet etching.

Figure 11:
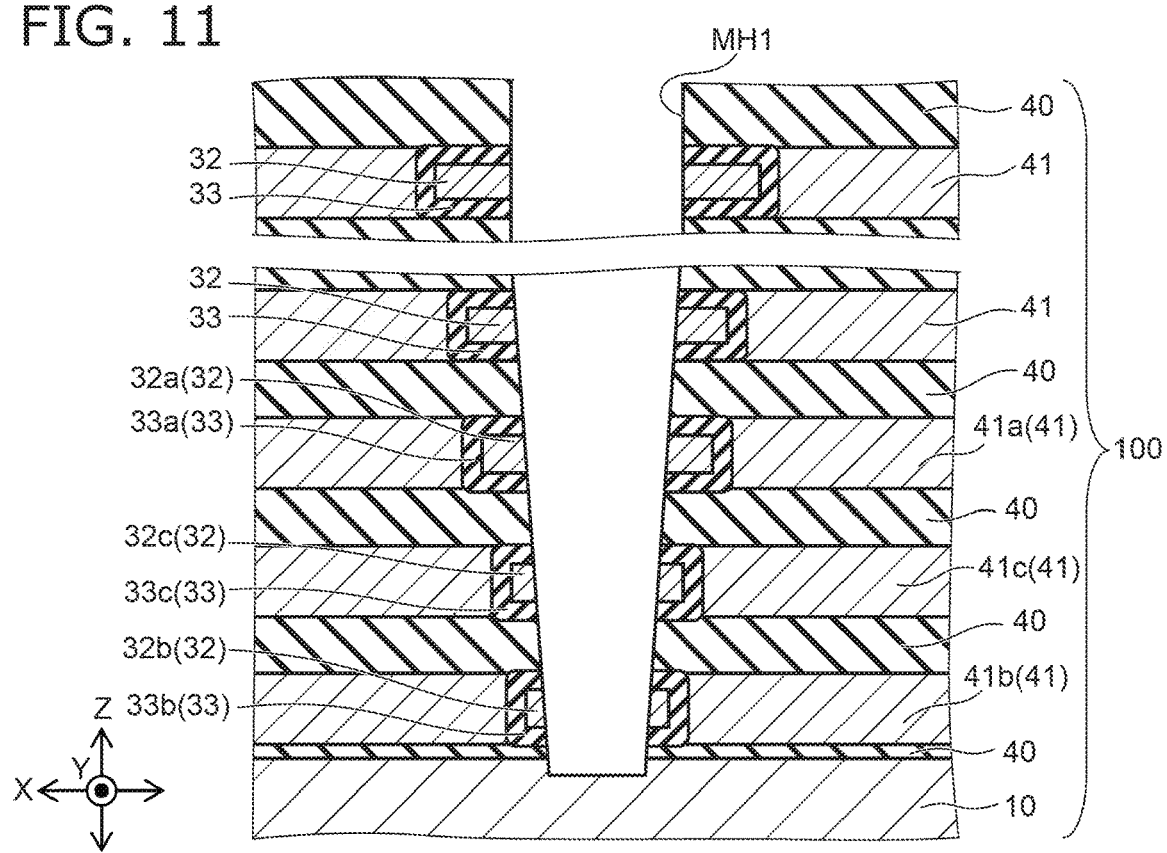

As shown in FIG. 11, an etching process is performed on the end face of the electrode layer 41 exposed in the memory hole MH1. For example, etchant is supplied into the memory hole MH1. Thus, the end face of the electrode layer 41 exposed in the memory hole MH1 retreats.

By performing the processes shown in FIGS. 9 and 10, the retreat amount of the end face of the electrode layer 41 increases as the distance from the substrate 10 increases. Note that in the case where the retreat amount of the end face of the electrode layer 41 can be controlled according to the conditions of the etching process or the like, the sacrificial member 50a may not be formed. For example, when the electrode layer 41 contains silicon and impurity, the etching rate may be controlled by changing the impurity concentration for each electrode layer 41.

Next, as shown in FIG. 11, the block insulating film 33 is formed on the inner wall of the space generated by the retraction of the electrode layer 41. The block insulating film 33 is formed of, for example, a material containing aluminum oxide. The block insulating film 33 may be formed of a material containing, for example, silicon oxide. Thereafter, the charge storage portion 32 is formed in the space by the retraction of the electrode layer 41. The charge storage portion 32 is formed of a material containing, for example, polysilicon or silicon nitride. Further, the block insulating film 33 and the charge storage portion 32 are etched back by chemical dry etching or the like up to a place where there is no step from the memory hole MH1 and they are aligned with the insulator 40, and are separated for each layer. Thus, the space generated by the retraction of the electrode layer 41 is filled with the block insulating film 33 and the charge storage portion 32.

Figure 12:
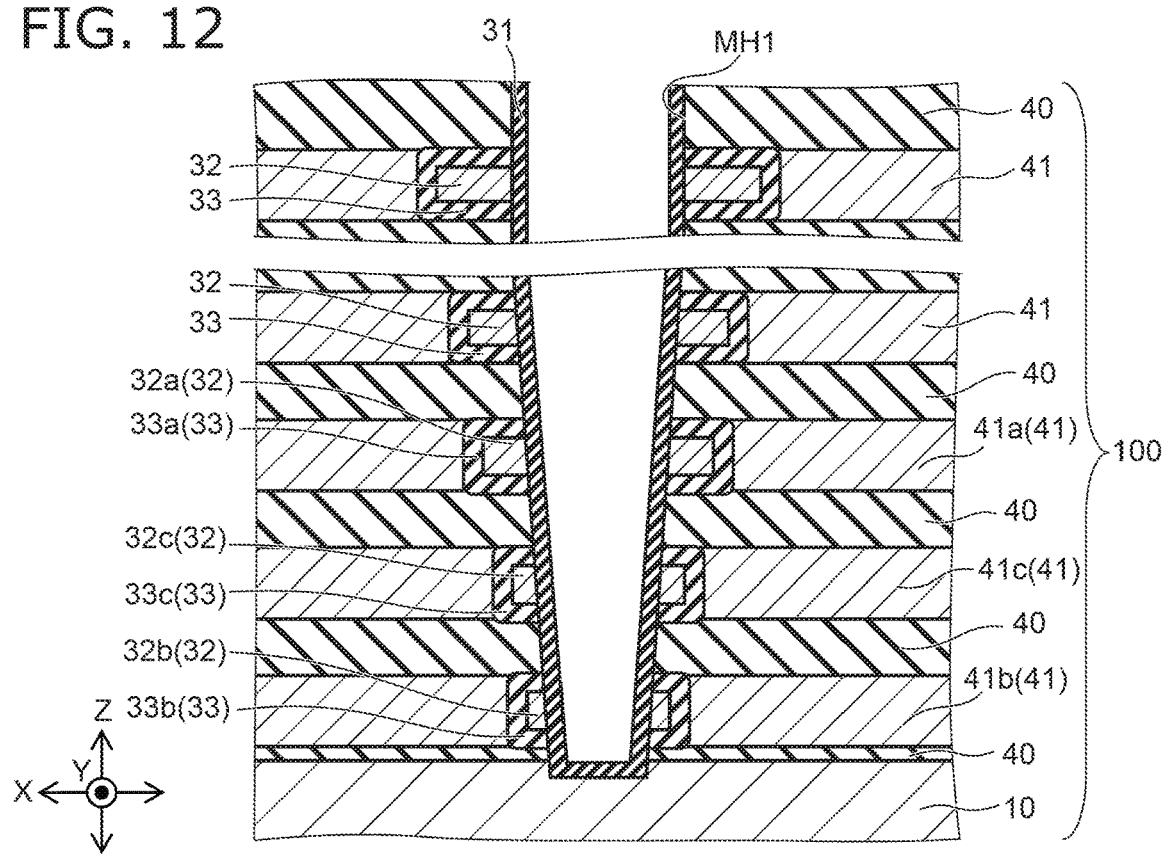

As shown in FIG. 12, the tunnel insulating film 31 is formed on the inner wall of the memory hole MH1. The tunnel insulating film 31 is formed of at least one material selected from the group consisted of for example, silicon oxide, silicon oxynitride, and silicon nitride. The tunnel insulating film 31 may be formed as a stacked film including a silicon oxide film, a silicon oxynitride film, and a silicon nitride film.

Figure 13:
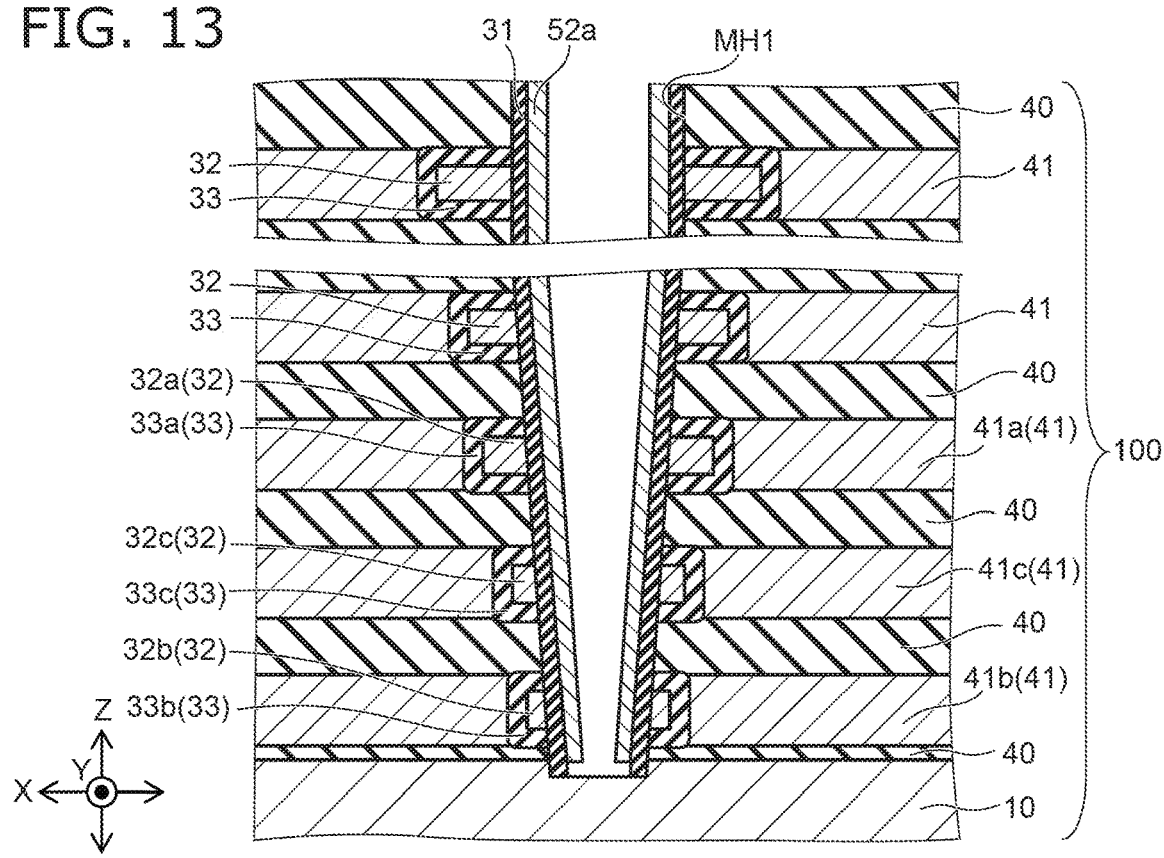

As shown in FIG. 13, the semiconductor film 52a is formed on the tunnel insulating film 31. The tunnel insulating film 31 and the semiconductor film 52a formed at the bottom of the memory hole MH1 are removed by anisotropic etching. At this time, the tunnel insulating film 31 and the semiconductor film 52a formed on the side wall of the memory hole MH1 remain. The tunnel insulating film 31 formed on the side wall of the memory hole MH1 is protected from the influence of anisotropic etching by the semiconductor film 52a formed thereon.

Thereafter, the semiconductor body 52 is formed in the memory hole MH1 as shown in FIG. 2. The semiconductor body 52 is electrically connected to the substrate 10. The semiconductor film 52a is a part of the semiconductor body 52. Thereafter, the core portion 51 is formed in the memory hole MH1. The core portion 51 is formed of, for example, a material containing silicon oxide. The memory hole MH1 is filled with the semiconductor body 52 and the core portion 51.

The semiconductor device of the first embodiment can be manufactured by, for example, such a manufacturing method.

In the manufacturing method of the semiconductor device of the first embodiment, the sacrificial member 50a is formed in the memory hole MH1. Thus, the retreat amount of the end face of the electrode layer 41 is controlled, as shown in FIGS. 8 and 9.

In the manufacturing method of the semiconductor device of the first embodiment, the impurity concentration may be changed for each electrode layer 41. For example, the farther from the substrate 10, the higher the impurity concentration of the electrode layer 41 may be. Thus, the etching rate of the electrode layer 41 can be controlled. For example, when performing the processes shown in FIGS. 8 and 9, the etching conditions are relaxed. For example, it is possible to control the retreat amount of the end face of the electrode layer 41 without forming the sacrificial member 50a.

Figure 14:
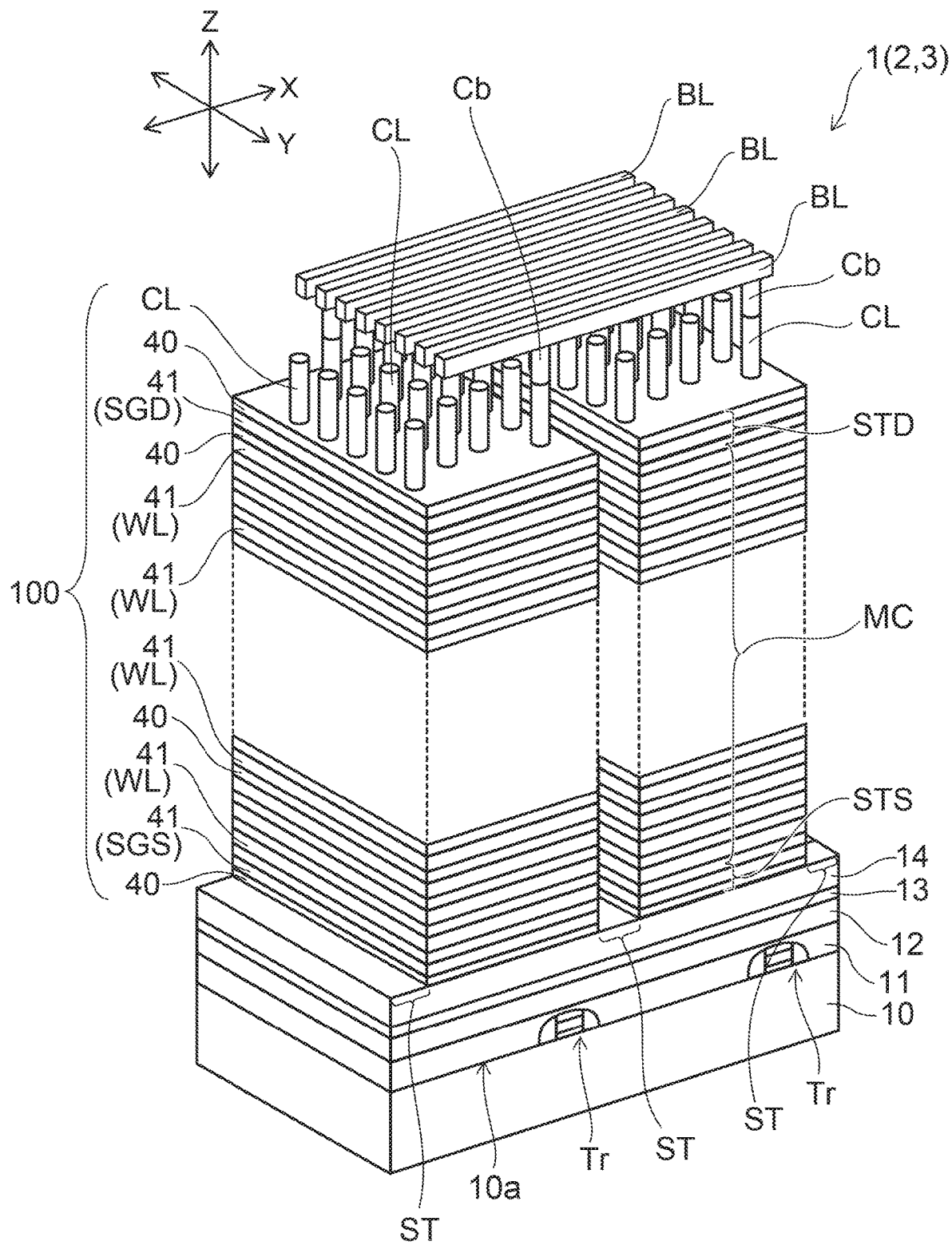
FIG. 14 is a schematic perspective view of a memory cell array of a semiconductor device of another example of the first embodiment.

FIG. 14 is a schematic perspective view of a memory cell array of a semiconductor device of another example of the first embodiment.

Although the memory cell array is formed on the substrate 10 in the above example, a buried source line electrode containing polysilicon or tungsten may be formed flat on a peripheral circuit formed on a silicon substrate, and a memory cell array may be formed on the buried source line electrode.

In this case, a peripheral circuit 11 is provided on the major surface 10a of the substrate 10 as shown in FIG. 14. The peripheral circuit 11 includes a transistor Tr provided in the insulating film. A source line electrode 12 (a buried source line electrode) is provided on the peripheral circuit 11. An insulating film 13 is provided on the source line electrode 12. A semiconductor layer 14 is provided on the insulating film 13. The stacked body 100 is provided on the semiconductor layer 14.

Second Embodiment

Semiconductor Device

Figure 15:
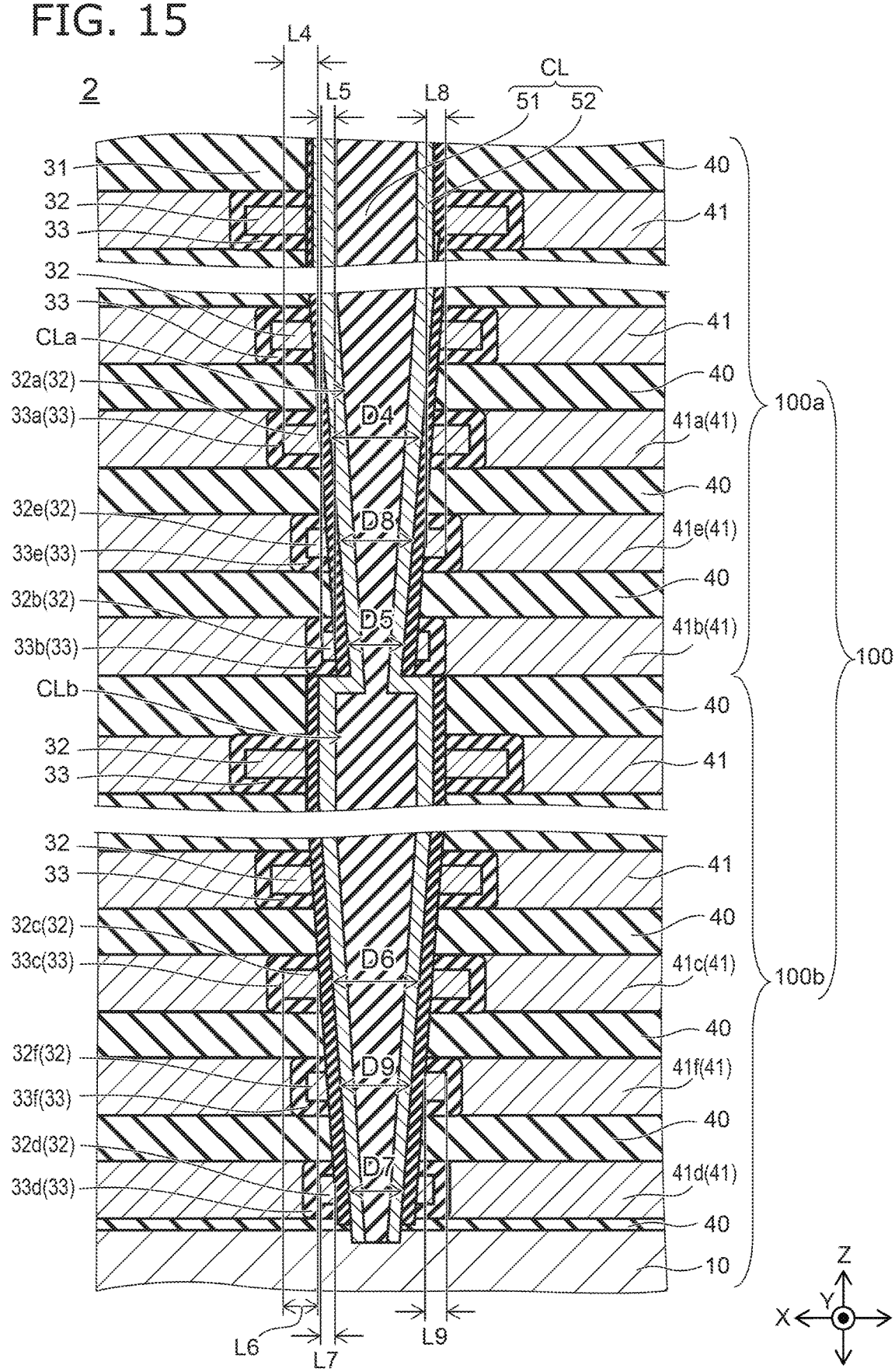
FIG. 15 is a schematic sectional view of the memory cell array of the semiconductor device of the first embodiment.
Figure 16:
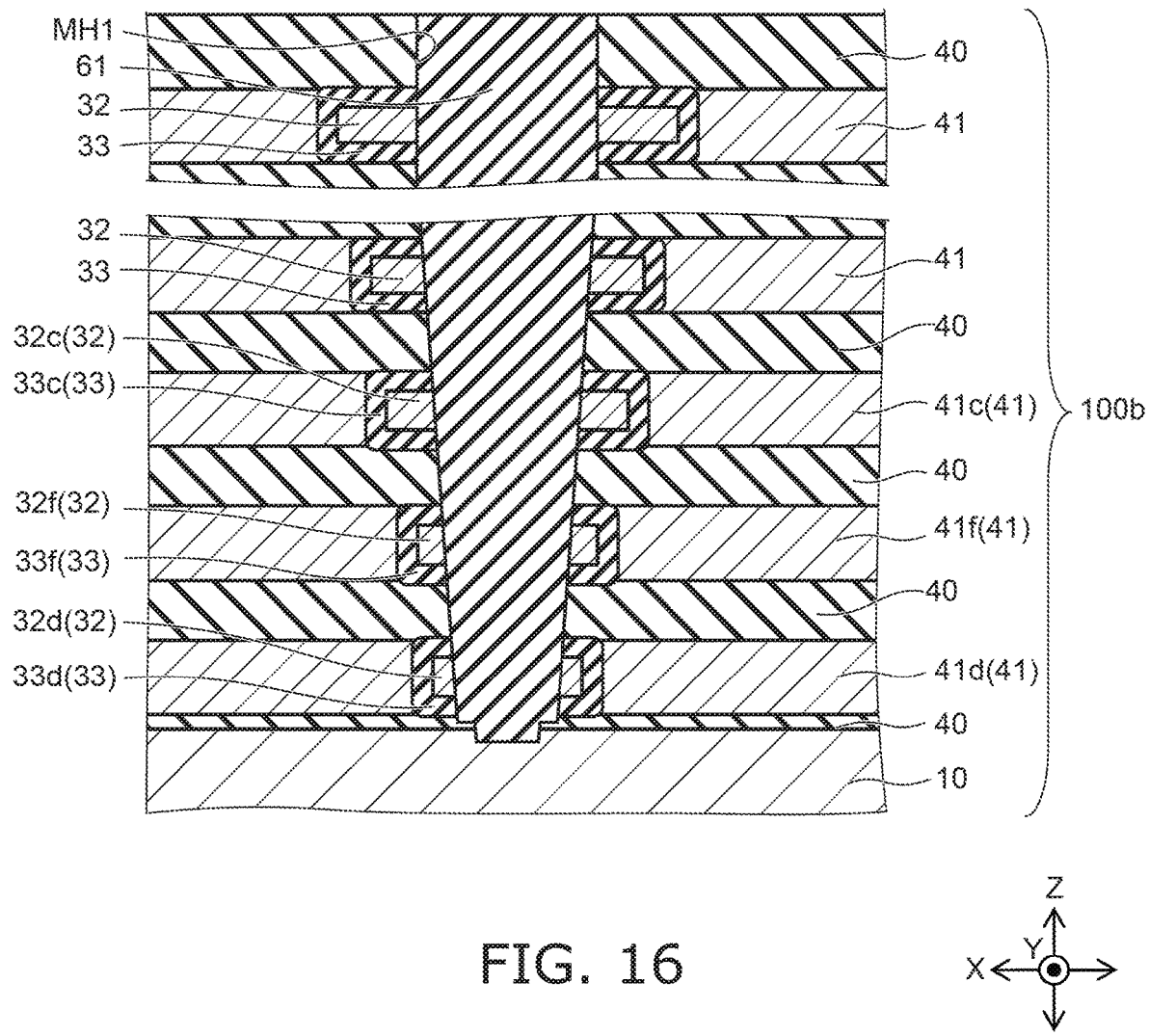
FIGS. 16 to 21 are schematic sectional views showing the manufacturing method of the semiconductor device of the second embodiment.

FIG. 15 is a schematic sectional view of the memory cell array of the semiconductor device of the first embodiment. FIG. 15 corresponds to a part of a cross section parallel to the XZ plane in FIG. 1. FIG. 15 is a schematic sectional view obtained by extracting the columnar portion CL and its surrounding portion.

As shown in FIG. 15, a memory cell array 2 of the semiconductor device of the first embodiment includes a stacked body 100, a columnar portion CL, a tunnel insulating film 31, a plurality of charge storage portions 32, and a plurality of block insulating films 33.

The stacked body 100 includes a plurality of electrode layers 41 stacked on a substrate 10 in the Z-direction with an insulator 40 interposed therebetween. The stacked body 100 includes a stacked portion 100a including a part of the plurality of electrode layers 41 and a stacked portion 100b including another part of the plurality of electrode layers 41. The stacked portion 100a is provided on the substrate 10.

The stacked portion 100b is provided between the substrate 10 and the stacked portion 100a.

The columnar portion CL extends in the stacked body 100 in the Z-direction. The columnar portion CL includes a first columnar portion CLa provided in the stacked portion 100a and a second columnar portion CLb provided in the stacked portion 100b.

For example, the first columnar portion CLa and the second columnar portion CLb each have a tapered shape. For example, the smaller the diameter of the first columnar portion CLa, the closer to the substrate 10 the first columnar portion CLa is. The smaller the diameter of the second columnar portion CLb, the closer to the substrate 10 the second columnar portion CLb is. For example, the diameter of the lower end of the first columnar portion CLa is smaller than the diameter of the upper end of the second columnar portion CLb.

The plurality of charge storage portions 32 are provided between the columnar portion CL and the plurality of electrode layers 41. In the stacked portion 100a, the shorter the thickness of the charge storage portion 32 between the columnar portion CL and one electrode layer 41, the closer to the stacked portion 100b the charge storage portion 32 is. In the stacked portion 100b, the smaller the thickness of the charge storage portion 32 between the columnar portion CL and one electrode layer 41, the closer to the substrate 10 the charge storage portion 32 is.

Examples of the plurality of electrode layers 41 include a first electrode layer 41a, a second electrode layer 41b, a third electrode layer 41c, a fourth electrode layer 41d, a fifth electrode layer 41e, and a sixth electrode layer 41f.

The first electrode layer 41a, the second electrode layer 41b, and the fifth electrode layer 41e are included in the stacked portion 100a. The third electrode layer 41c, the fourth electrode layer 41d, and the sixth electrode layer 41f are included in the stacked portion 100b.

The second electrode layer 41b is disposed between the first electrode layer 41a and the stacked portion 100b. The fourth electrode layer is disposed between the third electrode layer 41c and the substrate 10. The fifth electrode layer 41e is disposed between the first electrode layer 41a and the third electrode layer 41c. The sixth electrode layer 41f is disposed between the third electrode layer 41c and the fourth electrode layer 41d.

Examples of the plurality of charge storage portions 32 include a first charge storage portion 32a, a second charge storage portion 32b, a third charge storage portion 32c, a fourth charge storage portion 32d, a fifth charge storage portion 32e, and a sixth charge storage portion 32f.

The first charge storage portion 32a is disposed between the first columnar portion CLa and the first electrode layer 41a. The second charge storage portion 32b is disposed between the first columnar portion CLa and the second electrode layer 41b. The third charge storage portion 32c is disposed between the second columnar portion CLb and the third electrode layer 41c. The fourth charge storage portion 32d is disposed between the second columnar portion CLb and the fourth electrode layer 41d. The fifth charge storage portion 32e is disposed between the first columnar portion CLa and the fifth electrode layer 41e. The sixth charge storage portion 32f is disposed between the second columnar portion CLb and the sixth electrode layer 41f.

The thickness L4 in the X-direction of the first charge storage portion 32a between the first electrode layer 41a and the first columnar portion CLa is thicker than the thickness L5 in the X-direction of the second charge storage portion 32b between the second electrode layer 41b and the first columnar portion CLa. The thickness L6 in the X-direction of the third charge storage portion 32c between the third electrode layer 41c and the second columnar portion CLb is thicker than the thickness L7 in the X-direction of the fourth charge storage portion 32d between the fourth electrode layer 41d and the second columnar portion CLb. The thickness L5 is smaller than the thickness L6.

The thickness L8 in the X-direction of the fifth charge storage portion 32e between the fifth electrode layer 41e and the first columnar portion CLa is a thickness not more than the thickness L4, and the thickness L8 is a thickness not less than the thickness L5. The thickness L9 in the X-direction of the sixth charge storage portion 32f between the sixth electrode layer 41f and the second columnar portion CLb is a thickness not more than the thickness L6, and the thickness L9 is a thickness not less than the thickness L7.

The block insulating film 33 is provided between the electrode layer 41 and the charge storage portion 32. Examples of the plurality of block insulating films 33 include a first block insulating film 33a, a second block insulating film 33b, a third block insulating film 33c, a fourth block insulating film 33d, a fifth block insulating film 33e, and a sixth block insulating film 33f.

The first block insulating film 33a is disposed between the first charge storage portion 32a and the first electrode layer 41a. The second block insulating film 33b is disposed between the second charge storage portion 32b and the second electrode layer 41b. The third block insulating film 33c is disposed between the third charge storage portion 32c and the third electrode layer 41c. The fourth block insulating film 33d is disposed between the fourth charge storage portion 32d and the fourth electrode layer 41d. The fifth block insulating film 33e is disposed between the fifth charge storage portion 32e and the fifth electrode layer 41e. The sixth block insulating film 33f is disposed between the sixth charge storage portion 32f and the sixth electrode layer 41f.

A tunnel insulating film 31 is provided between the columnar portion CL and the charge storage portion 32 and between the columnar portion CL and the insulator 40. For the example, the smaller the inner diameter of the tunnel insulating film 31 between the first columnar portion CLa and the charge storage portion 32, the closer to the stacked portion 100b the tunnel insulating film 31 is. For example, the smaller the inner diameter of the tunnel insulating film 31 between the second columnar portion CLb and the charge storage portion 32, the closer to the substrate 10 the tunnel insulating film 31 is. The inner diameter of the tunnel insulating film 31 provided around the lower end of the first columnar portion CLa is smaller than the inner diameter of the tunnel insulating film 31 provided around the upper end of the second columnar portion CLb.

For example, the size of the inner diameter D4 of the tunnel insulating film 31 between the first columnar portion CLa and the first charge storage portion 32a is larger than the size of the inner diameter D5 of the tunnel insulating film 31 between the first columnar portion CLa and the second charge storage portion 32b. For example, the size of the inner diameter D6 of the tunnel insulating film 31 between the second columnar portion CLb and the third charge storage portion 32c is larger than the size of the inner diameter D7 of the tunnel insulating film 31 between the second columnar portion CLb and the fourth charge storage portion 32d. For example, the size of the inner diameter D6 is larger than the size of the inner diameter D5.

For example, the size of the inner diameter D8 of the tunnel insulating film 31 between the first columnar portion CLa and the fifth charge storage portion 32e is not more than the inner diameter D4. The size of the inner diameter D8 is not less than the size of the inner diameter D5. For example, the size of the inner diameter D9 of the tunnel insulating film 31 between the second columnar portion CLb and the sixth charge storage portion 32f is not more than the inner diameter D6. The size of the inner diameter D9 is not less than the size of the inner diameter D7.

In the case where the electrode layer 41 contains silicon and impurity, the impurity concentration may vary for each electrode layer 41 in each stacked portion (the stacked portion 100a and the stacked portion 100b). For example, in a case where the electrode layer 41 included in the stacked portion 100a contains silicon and impurity, the higher the impurity concentration, the farther from the stacked portion 100b the electrode layer 41 is. In the case where the electrode layer 41 included in the stacked portion 100b contains silicon and impurity, the higher the impurity concentration may be, the farther from the substrate 10 the electrode layer 41 is.

In the semiconductor device of the second embodiment, the smaller the thickness of each charge storage portion 32 between the columnar portion CL and the electrode layer 41, the smaller the diameter of the corresponding tunnel insulating film 31. This prevents the difference between the inner diameter of the block insulating film 33 and the inner diameter of the tunnel insulating film 31 from increasing. Thus, the variations in the coupling ratio are suppressed between the upper and lower layers of the memory cell array. For example, the variations in the write speed can be suppressed between the upper and lower layers of the memory cell array. In addition, it is possible to suppress read disturb and write disturb. This improves the stability of the write operation and the read operation.

In the second embodiment, the impurity concentration of the electrode layer 41 may be changed in the respective stacked portions (the stacked portion 100a and the stacked portion 100b). Therefore, the lower the resistivity of the electrode layer 41, the higher the impurity concentration of the electrode layer 41. For example, the larger the diameter of the portion of the tunnel insulating film 31 corresponding to the electrode layer 41, the lower the resistivity may be. For example, it is possible to correct the signal propagation delay of the word line caused by the difference in word line resistance, due to a difference between the memory hole diameters of the upper and lower layers of the memory cell array, by controlling the resistivity of the electrode layer 41.

Manufacturing Method

FIGS. 16 to 21 are schematic sectional views showing the manufacturing method of the semiconductor device of the second embodiment. FIGS. 16 to 21 correspond to the cross section shown in FIG. 14.

First, the processes shown in FIGS. 6 to 11 are performed in the same manner as in the first embodiment. Thus, the stacked portion 100b having a memory hole MH1, the charge storage portion 32, and the block insulating film 33 are formed, as shown in FIG. 15. The stacked portion 100b corresponds to the stacked body 100 shown in FIG. 11. A sacrificial member 61 is formed in the memory hole MH1. The memory hole MH1 is filled with the sacrificial member 61.

Figure 17:
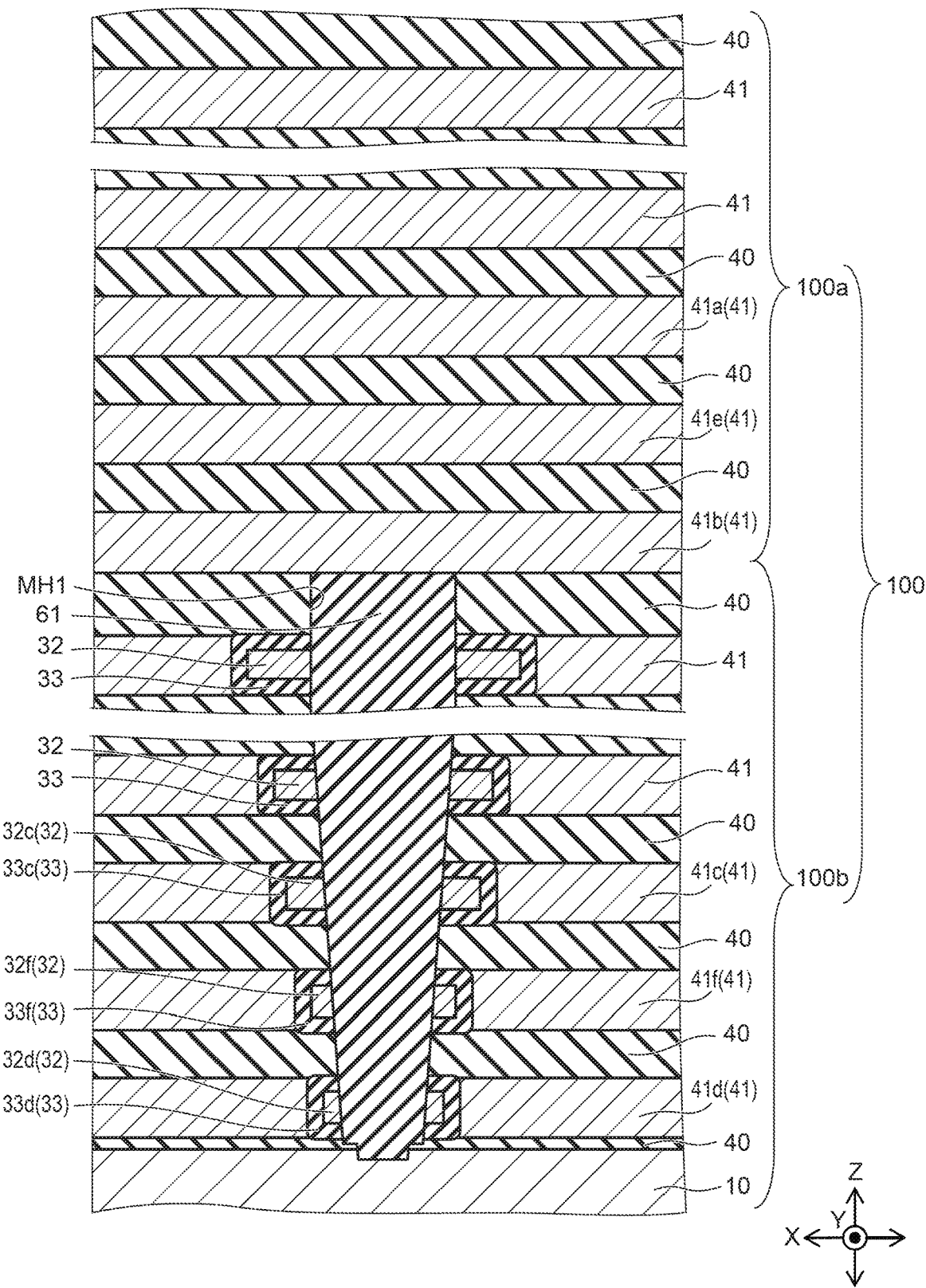

As shown in FIG. 17, the insulator 40 which is a third layer and the electrode layer 41 which is a fourth layer are stacked alternately on the stacked portion 100b. Thereby, the stacked portion 100a is formed on the stacked portion 100b.

In the stacked portion 100b, for example, the electrode layer 41 is formed of a material containing doped silicon. Examples of the doped silicon include one or more materials selected from the group consisted of phosphorus, arsenic, and boron. For example, the higher the impurity concentration of the electrode layer 41 may be, the farther from the stacked portion 100b the electrode layer 41 is. For example, the electrode layer 41 may be formed of a material containing a metal such as tungsten or molybdenum.

Figure 18:
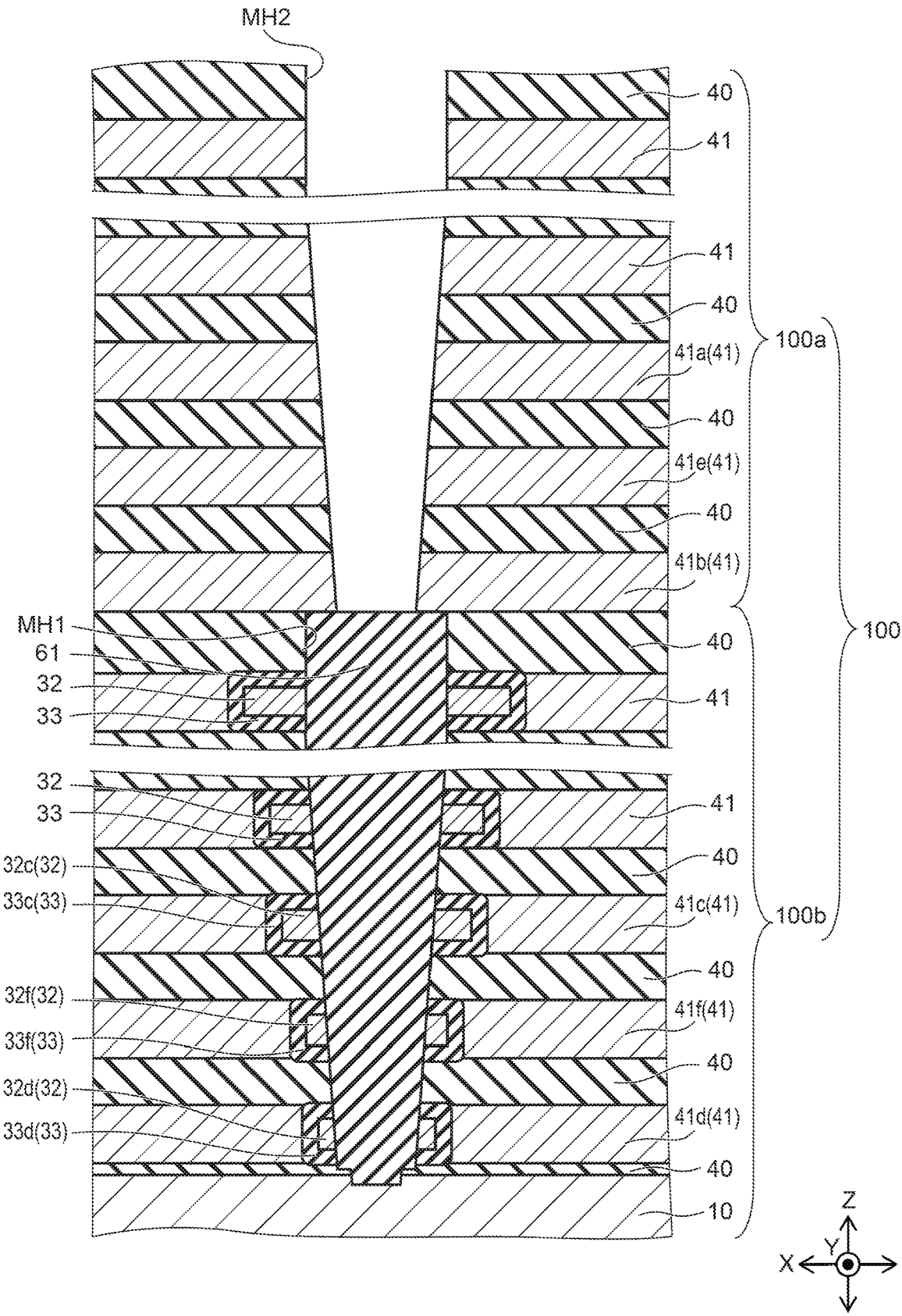

As shown in FIG. 18, a memory hole MH2 is formed on the sacrificial member 61. The memory hole MH2 penetrates the stacked portion 100a in the Z-direction. The upper surface of the sacrificial member 61 is exposed at the bottom of the memory hole MH2.

Figure 19:
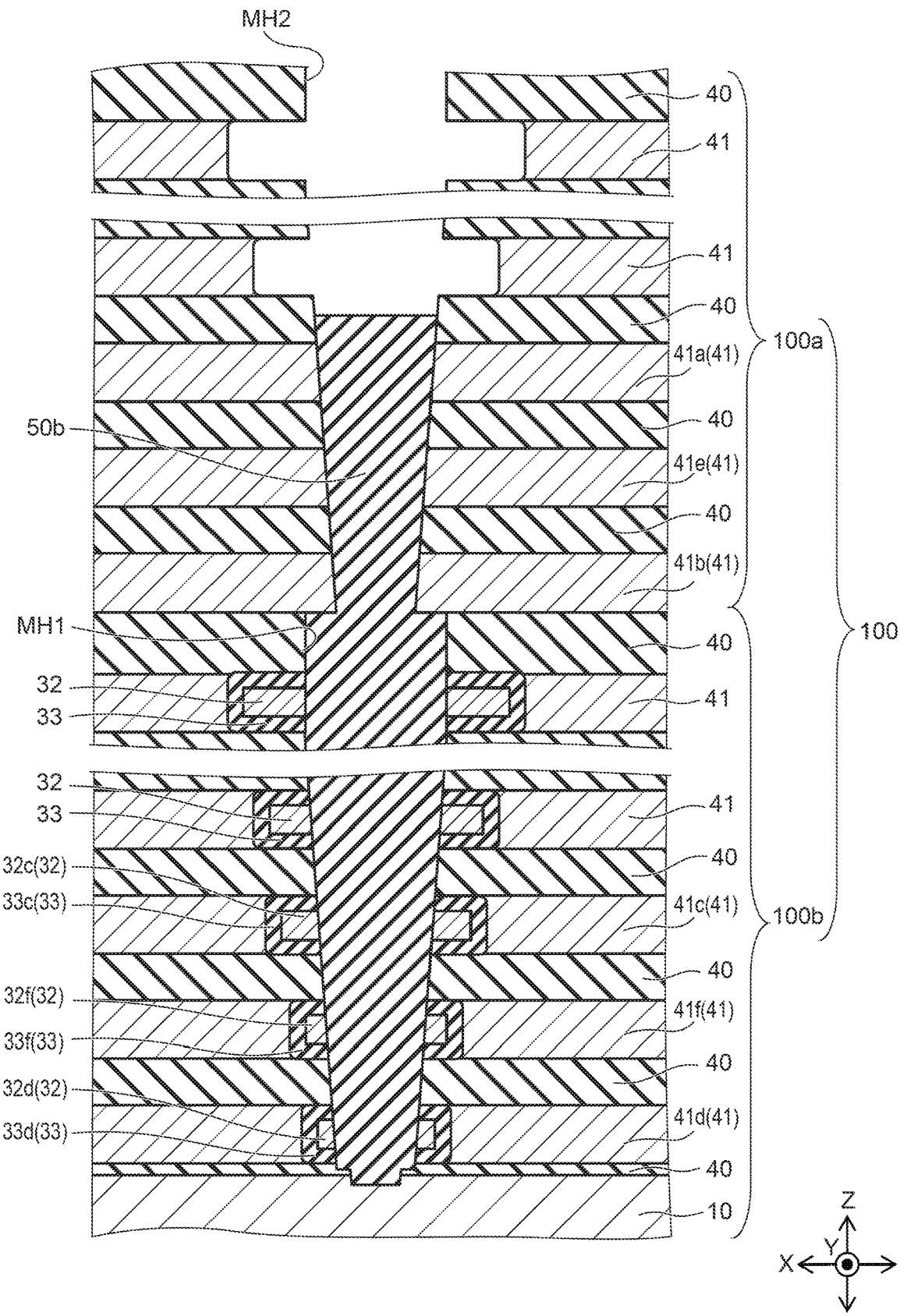

As shown in FIG. 19, a sacrificial member 50b is formed in the memory hole MH2. For example, the sacrificial member 50b is formed in the lower part of the memory hole MH1. Thereafter, an etching process is performed on the end face of the electrode layer 41 exposed in the memory hole MH2. For example, an etchant is supplied into the memory hole MH2. Thus, the end face of the electrode layer 41 exposed in the memory hole MH2 retreats. At this time, the end portion of the electrode layer 41 in the lower part of the memory hole MH2 is covered with the sacrificial member 50b. Therefore, the end portion of the electrode layer 41 in the lower part of the memory hole MH2 is not etched.

Figure 20:
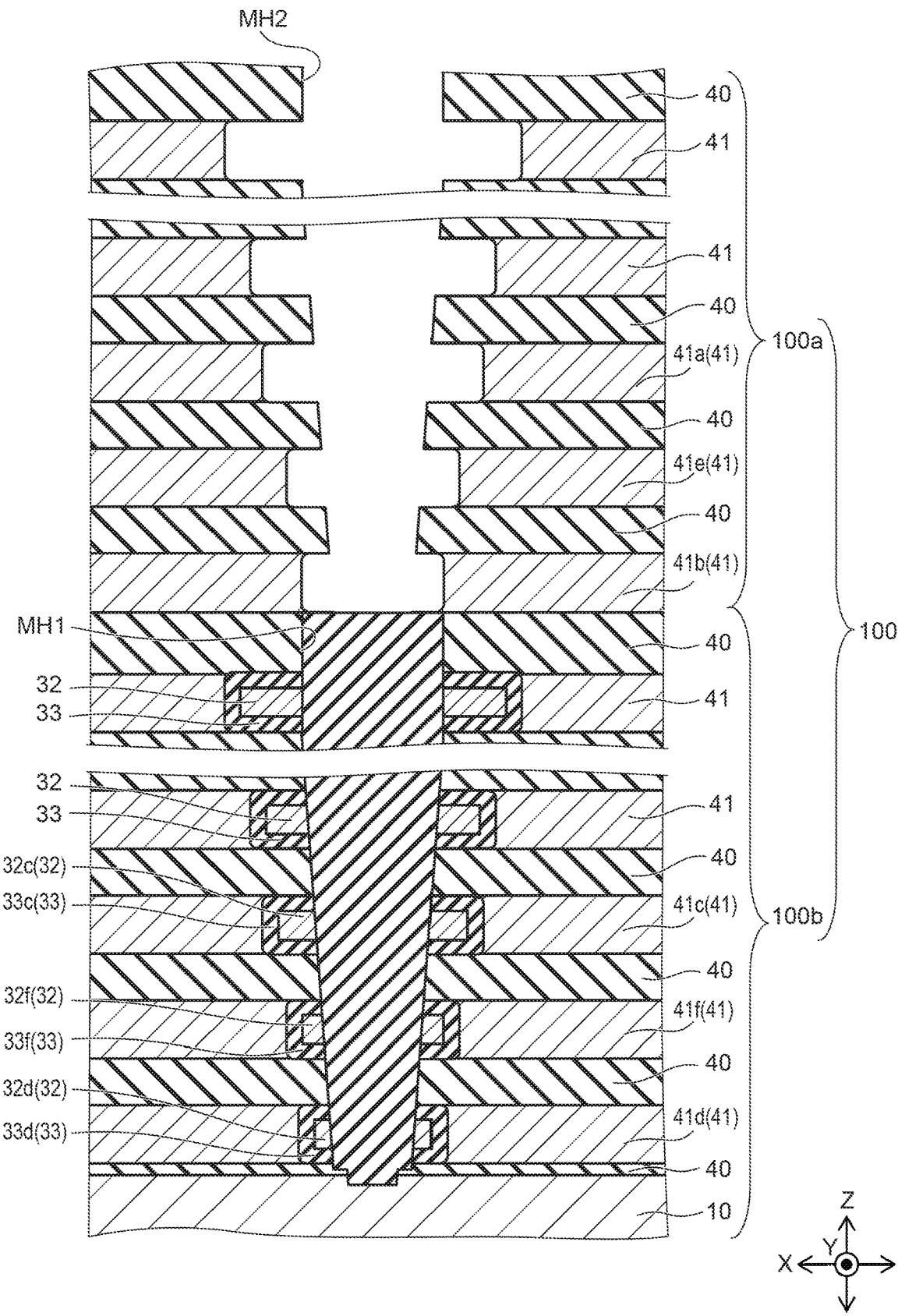

As shown in FIG. 20, the sacrificial member 50b is removed by an etching process such as chemical dry etching. Thereafter, an etching process is performed on the exposed face of the electrode layer 41. For example, an etchant is supplied into the memory hole MH2. Thus, the end face of the electrode layer 41 exposed in the memory hole MH2 retreats.

By performing the processes shown in FIGS. 19 and 20, the retreat amount of the end face of the electrode layer 41 of the stacked portion 100a increases as the distance from the stacked portion 100b increases. Note that in the case where the retreat amount of the end face of the electrode layer 41 can be controlled according to the conditions of the etching process or the like, the sacrificial member 50b may not be formed. For example, in a case where the electrode layer 41 contains silicon and impurity, the etching rate may be controlled by changing the impurity concentration for each electrode layer 41.

Figure 21:
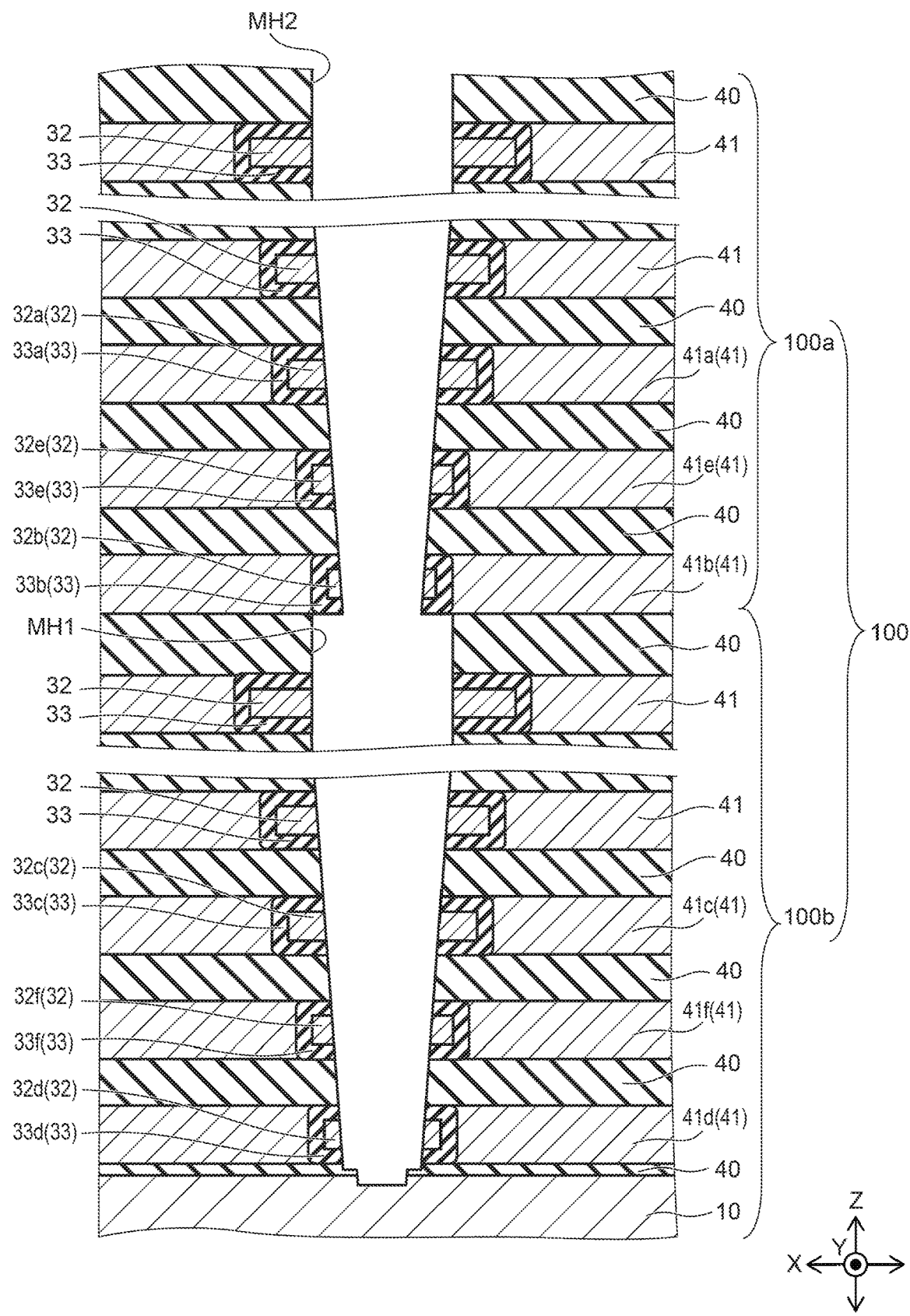

As shown in FIG. 21, a block insulating film 33 is formed on the inner wall of the space generated by the retraction of the electrode layer 41 of the stacked portion 100a. The block insulating film 33 is formed of, for example, a material containing aluminum oxide. The block insulating film 33 may be formed of, for example, a material containing silicon oxide. Thereafter, a charge storage portion 32 is formed in the space generated by the retraction of the electrode layer 41 of the stacked portion 100a. The charge storage portion 32 is formed of, for example, a material containing polysilicon or silicon nitride. Further, the block insulating film 33 and the charge storage portion 32 are etched back by chemical dry etching or the like up to a place where there is no step from the memory holes MH1 and MH2 and they are aligned with the insulator 40, and are separated for each layer. Thus, the block insulating film 33 and the charge storage portion 32 are formed in the stacked portion 100a. Thereafter, a sacrificial member 50a is removed by an etching process such as chemical dry etching.

As shown in FIG. 15, the tunnel insulating film 31 is formed on the side wall of the memory holes MH1 and MH2. A columnar portion CL is formed in the memory holes MH1 and MH2.

The semiconductor device of the second embodiment can be manufactured by for example, such a manufacturing method.

Third Embodiment

Semiconductor Device

Figure 22:
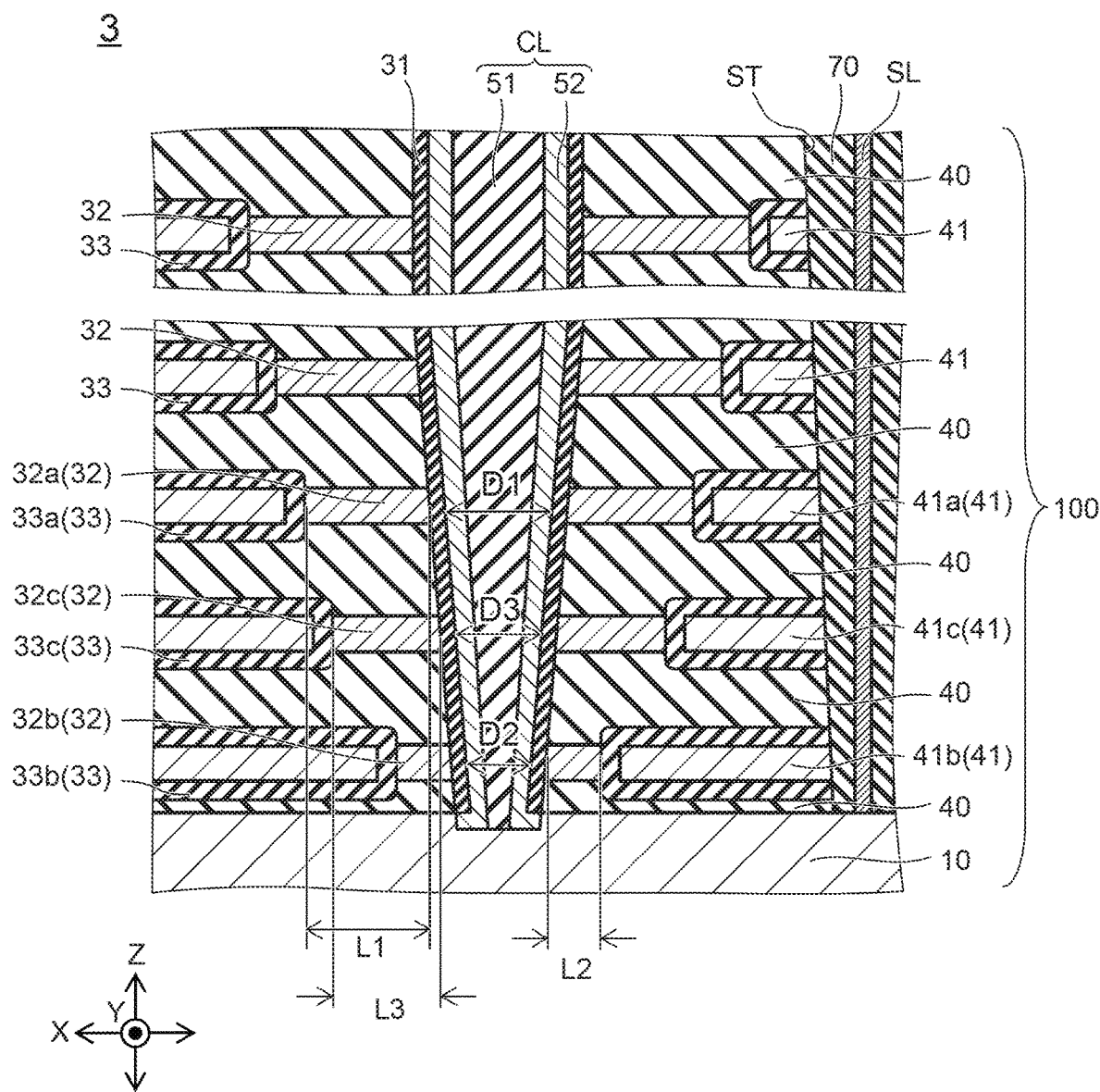
FIG. 22 is a schematic sectional view of a memory cell array of a semiconductor device of a third embodiment.

FIG. 22 is a schematic sectional view of a memory cell array of a semiconductor device of a third embodiment. FIG. 22 corresponds to a part of the cross section parallel to the XZ plane in FIG. 1. FIG. 22 is a schematic sectional view obtained by extracting a columnar portion CL and its surrounding portions.

As shown in FIG. 22, in the memory cell array 3 of the semiconductor device of the third embodiment, a block insulating film 33 is formed between a charge storage portion 32 and an electrode layer 41, and between the electrode layer 41 and an insulator 40. The block insulating film 33 may not be provided between the charge storage portion 32 and the insulator 40. The other configuration is the same as for example, the semiconductor device of the first embodiment. An insulator 70 is provided between the side wall of a separating portion ST and a source layer SL. The insulator 70 contains for example, silicon oxide.

Similar to the first example, the smaller the thickness of each charge storage portion 32 between the columnar portion CL and the electrode layer 41, the closer to the substrate 10 the charge storage portion 32 is. This prevents the difference between the inner diameter of the block insulating film 33 and the inner diameter of a tunnel insulating film 31 from increasing between the upper and lower layers of the memory cell array. This suppresses variations in the coupling ratio between the upper and lower layers of the memory cell array. For example, the variations in the write speed can be suppressed between the upper and lower layers of the memory cell array. In addition, it is possible to suppress read disturb and write disturb. This improves the stability of the write operation and the read operation.

Similar to the first embodiment, in a case where each electrode layer 41 contains doped silicon, the higher the impurity concentration of the electrode layer 41 may be, the farther from the substrate 10 the electrode layer 41 is. Thus, the lower the resistivity of the electrode layer 41, the farther from the substrate 10 the electrode layer 41 is. For example, it is possible to correct the signal propagation delay of the word line caused by the difference in word line resistance, due to a difference between the memory hole diameters of the upper and lower layers of the memory cell array, by controlling the resistivity of the electrode layer 41.

Manufacturing Method

FIGS. 23 to 26 are schematic sectional views showing the manufacturing method of the semiconductor device of the third embodiment. FIGS. 23 to 26 correspond to the cross section shown in FIG. 21.

First, the processes shown in FIG. 6 are performed. In the third embodiment, the insulator 40 which is a first layer and a replacement member 42 which is a second layer are alternately stacked on the substrate 10. Thereby, a stacked portion 100 is formed on the substrate 10. For example, the small the density of the replacement member 42 may be, the farther from the substrate 10 the replacement member 42 is.

The replacement member 42 is a layer which is later replaced by the electrode layer 41. The material of the replacement member 42 is selected from materials different from the insulator 40, of which the etching selection ratio can be obtained for the insulator 40. For example, when silicon oxide is selected as the insulator 40, silicon nitride is selected for the replacement member 42.

A memory hole MH1 is formed in the stacked body 100 by performing the processes shown in FIG. 7. After that, the end face of the replacement member 42 exposed in the memory hole MH1 is etched by performing the processes shown in FIGS. 8 to 10. Thus, the end portion of the replacement member 42 retreats. In a case where the retreat amount of the end face of the replacement member 42 can be controlled according to the conditions of the etching process or the like, formation of the sacrificial member 50a may be omitted. For example, the etching rate may be controlled by controlling the density of the replacement member 42.

Figure 23:
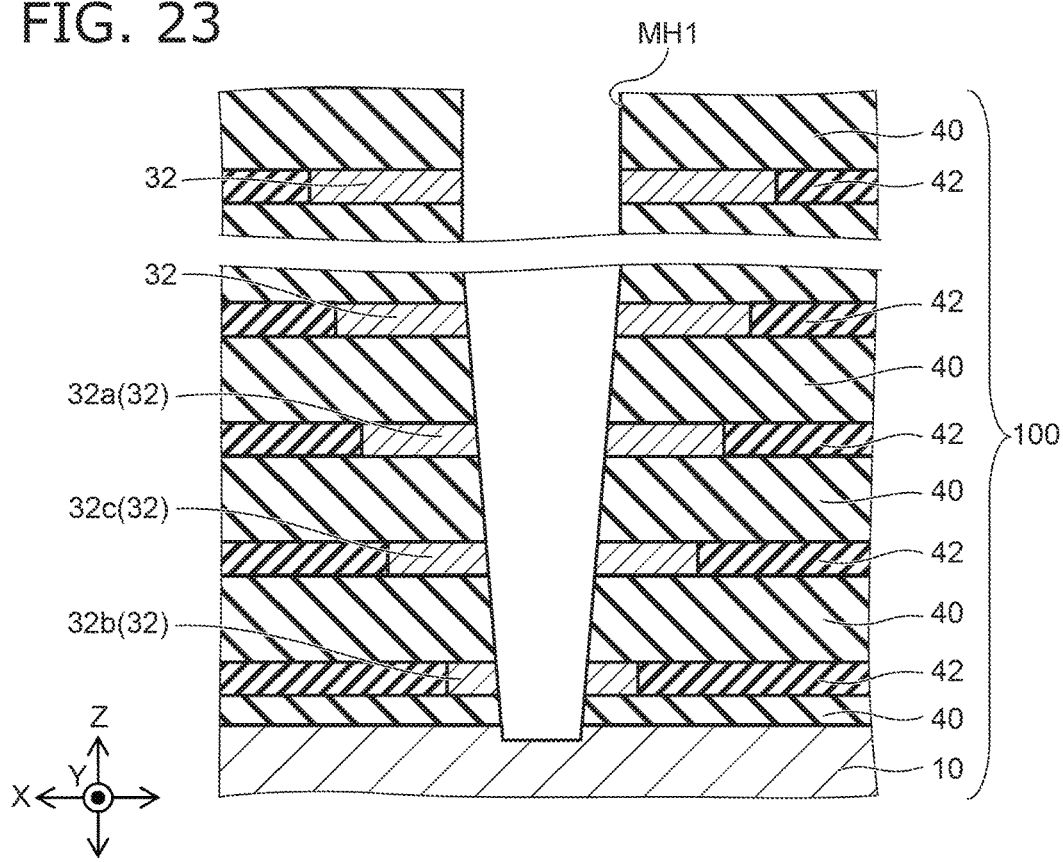
FIGS. 23 to 26 are schematic sectional views showing the manufacturing method of the semiconductor device of the third embodiment.

Thereafter, as shown in FIG. 23, the charge storage portion 32 is formed in the space generated by the retraction of the end portion of the replacement member 42, and the charge storage portion 32 is etched back by chemical dry etching or the like up to a place where there is no step from the memory hole MH1 and it is aligned with the insulator 40, and is separated for each layer.

Figure 24:
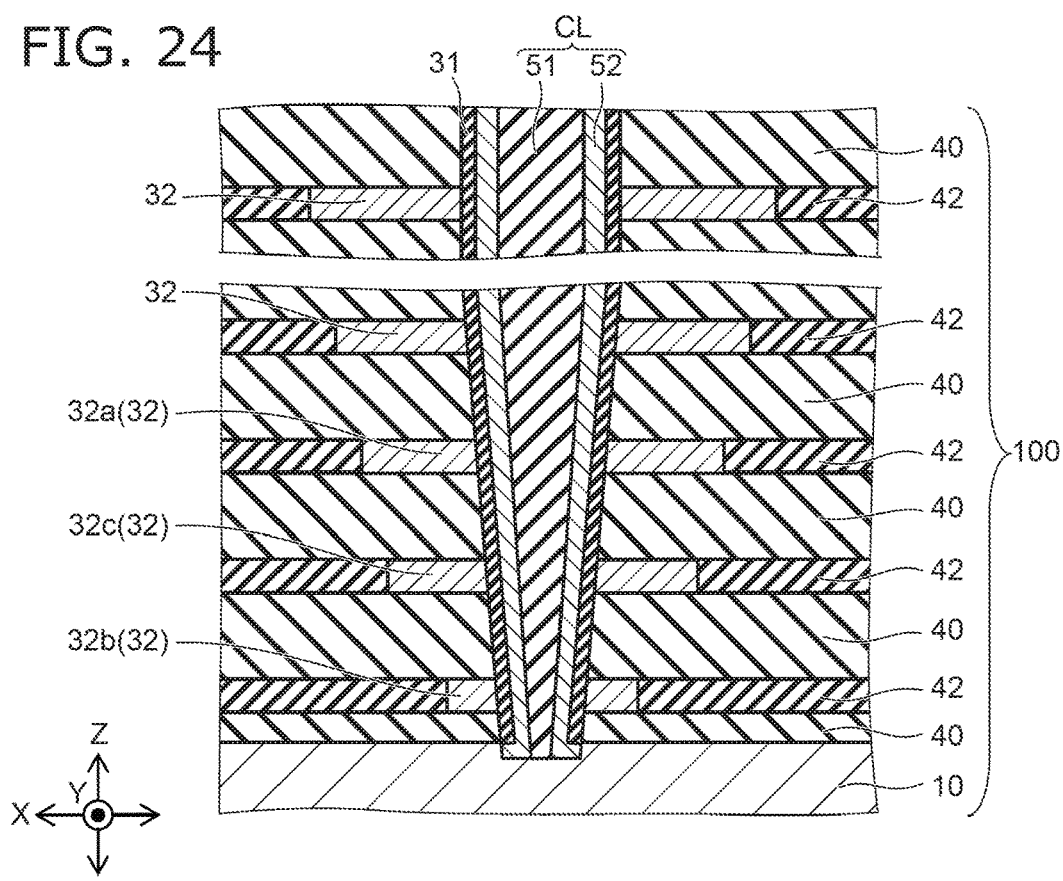

As shown in FIG. 24, the tunnel insulating film 31 is formed on the side wall of the memory hole MH1. Thereafter, the columnar portion CL is formed in the memory hole MH1.

Figure 25:
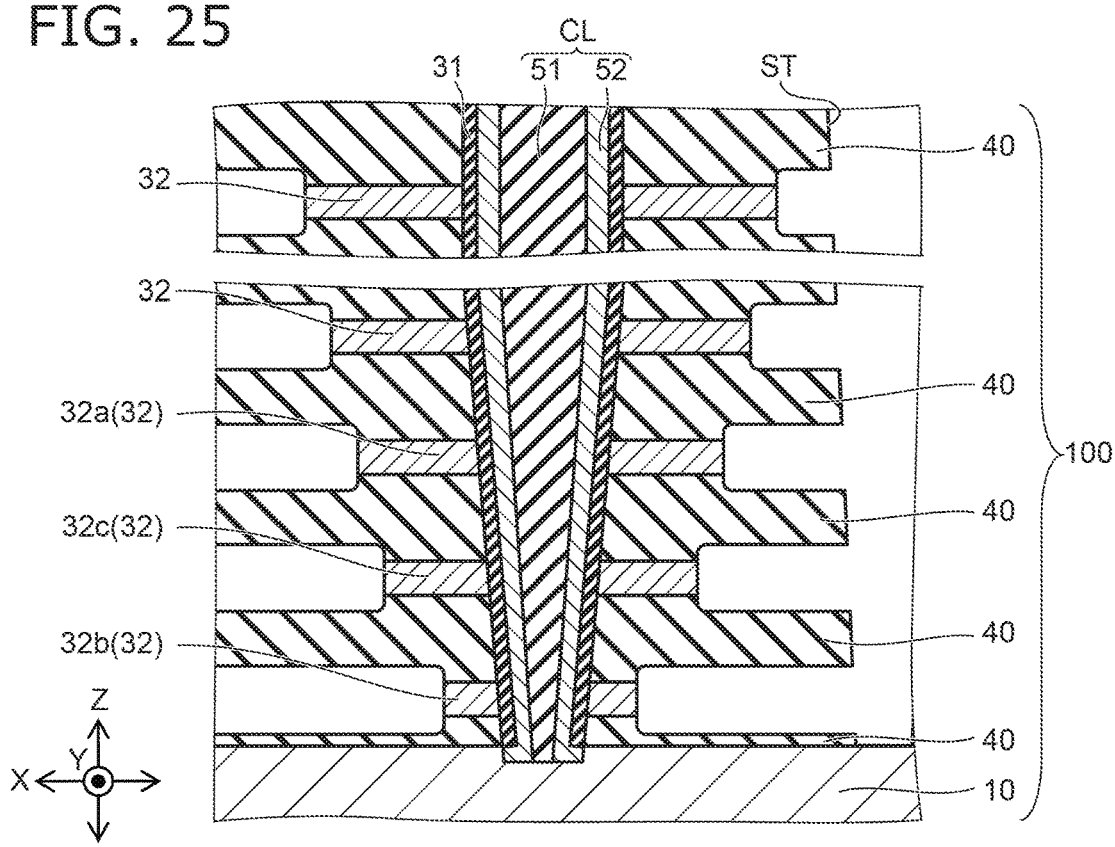

As shown in FIG. 25, the separating portion ST is formed in the stacked body 100. The separating portion ST is formed, for example, by performing anisotropical etching on the stacked body 100. Thereafter, the replacement member 42 is removed. The replacement member 42 is removed, for example, by a wet etching process through the separating portion ST.

Figure 26:
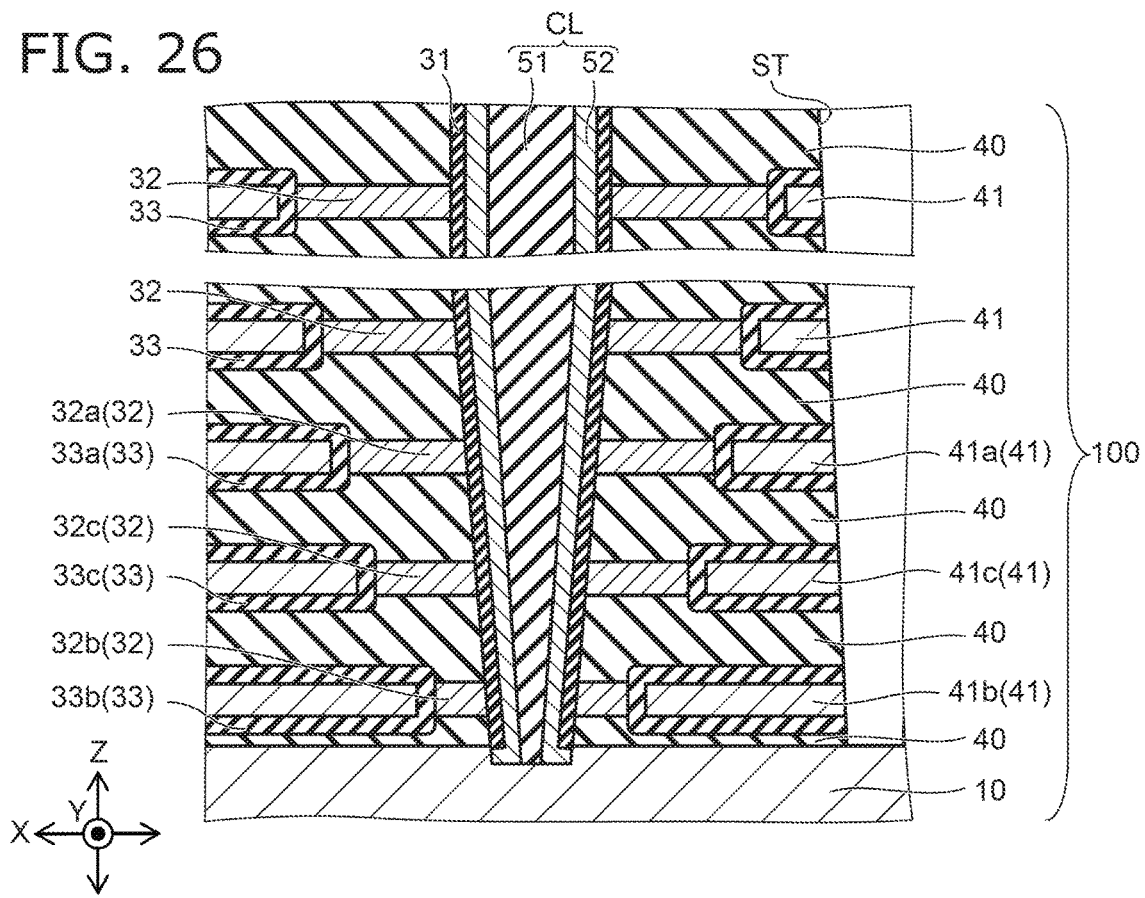

As shown in FIG. 26, the block insulating film 33 is formed on the inner wall of the space generated by removing the replacement member 42. The electrode layer 41 is formed in the space generated by removing the replacement member 42. After that, as shown in FIG. 22, the insulator 70 is formed on the side wall of the separating portion ST. The source layer SL is formed in the separating portion ST.

The semiconductor device of the third embodiment can be manufactured by, for example, such a manufacturing method.

As described above, according to the embodiment, a semiconductor device capable of suppressing variations in the coupling ratio can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device comprising:
a stacked body disposed above a substrate, the stacked body including a first electrode layer and a second electrode layer provided between the first electrode layer and the substrate;
a columnar portion extending in a first direction in the stacked body;
a first charge storage portion provided between the first electrode layer and the columnar portion; and
a second charge storage portion provided between the second electrode layer and the columnar portion, a first thickness in a second direction intersecting the first direction of the first charge storage portion between the first electrode layer and the columnar portion being thicker than a second thickness in the second direction of the second charge storage portion between the second electrode layer and the columnar portion, a diameter of a first portion of the columnar portion being larger than a diameter of a second portion of the columnar portion, the first portion being surrounded by the first charge storage portion, and the second portion being surrounded by the second charge storage portion.

2. The device according to claim 1, further comprising a third charge storage portion, wherein the stacked body further includes a third electrode layer provided between the first electrode layer and the second electrode layer, and the third charge storage portion is provided between the third electrode layer and the columnar portion, and a third thickness in the second direction of the third charge storage portion is a thickness not more than the first thickness, and the third thickness is not less than the second thickness.

3. The device according to claim 1, wherein a diameter of the columnar portion in the first electrode layer is larger than a diameter of the columnar portion in the second electrode layer.

4. The device according to claim 1, wherein each of the first electrode layer and the second electrode layer includes silicon and impurity.

5. The device according to claim 4, wherein a concentration of the impurity in the first electrode layer is higher than a concentration of the impurity in the second electrode layer.

6. The device according to claim 1, wherein each of the first electrode layer and the second electrode layer contains a metal.

7. The device according to claim 1, further comprising:
a tunnel insulating film provided between the columnar portion and the first charge storage portion and between the columnar portion and the second charge storage portion;
a first block insulating film provided between the first electrode layer and the first charge storage portion; and
a second block insulating film provided between the second electrode layer and the second charge storage portion.

8. The device according to claim 7, wherein a first inner diameter of the tunnel insulating film between the columnar portion and the first charge storage portion is larger than a second inner diameter of the tunnel insulating film between the columnar portion and the second charge storage portion.

9. The device according to claim 2, further comprising:
a tunnel insulating film provided between the columnar portion and the first charge storage portion, between the columnar portion and the second charge storage portion, and between the columnar portion and the third charge storage portion;
a first block insulating film provided between the first electrode layer and the first charge storage portion;
a second block insulating film provided between the second electrode layer and the second charge storage portion; and
a third block insulating film provided between the third electrode layer and the third charge storage portion,
a first inner diameter of the tunnel insulating film between the columnar portion and the first charge storage portion is larger than a second inner diameter of a tunnel insulating film between the columnar portion and the second charge storage portion, a third inner diameter of the tunnel insulating film between the columnar portion and the third charge storage portion is not more than the first inner diameter, and the third inner diameter is not less than the second inner diameter.

10. The device according to claim 1, further comprising:
a tunnel insulating film provided between the columnar portion and the first charge storage portion and between the columnar portion and the second charge storage portion,
wherein the stacked body further includes a first insulator provided between the first electrode layer and the second electrode layer and a second insulator provided between the second electrode layer and the substrate,
the tunnel insulating film is provided between the columnar portion and the first insulator and between the columnar portion and the second insulator, and
a fourth inner diameter of the tunnel insulating film between the columnar portion and the first insulator is larger than a fifth inner diameter of the tunnel insulating film between the columnar portion and the second insulator.

11. The device according to claim 1, wherein the first charge storage portion and the second charge storage portion are floating gates.

12. A semiconductor device comprising:
a first stacked body disposed above a substrate, the first stacked body including a first electrode layer and a second electrode layer provided between the first electrode layer and the substrate;
a first columnar portion extending in a first direction in the first stacked body;
a second stacked body disposed on the first stacked body, the second stacked body including a third electrode layer and a fourth electrode layer provided between the third electrode layer and the first stacked body;
a second columnar portion extending in the first direction in the second stacked body;
a first charge storage portion provided between the first electrode layer and the first columnar portion; and
a second charge storage portion provided between the fourth electrode layer and the second columnar portion,
a first thickness in a second direction intersecting the first direction of the first charge storage portion between the first electrode layer and the first columnar portion being thicker than a second thickness in the second direction of the second charge storage portion between the fourth electrode layer and the second columnar portion,
a diameter of a first portion of the first columnar portion being larger than a diameter of a second portion of the second columnar portion, the first portion being surrounded by the first charge storage portion, and the second portion being surrounded by the second charge storage portion.

13. The device according to claim 12, further comprising:
a third charge storage portion;
a fourth charge storage portion;
a fifth electrode layer provided between the first electrode layer and the second electrode layer; and
a sixth electrode layer provided between the third electrode layer and the fourth electrode layer,
wherein the third charge storage portion is provided between the fifth electrode layer and the first columnar portion, a third thickness in the second direction of the third charge storage portion is not more than the first thickness, and the fourth charge storage portion is provided between the sixth electrode layer and the second columnar portion, a fourth thickness in the second direction of the fourth charge storage portion is not less than the second thickness.

14. The device according to claim 12, wherein
a diameter of the first columnar portion in the first electrode layer is larger than a diameter of the first columnar portion in the second electrode layer, and
a diameter of the second columnar portion in the third electrode layer is larger than a diameter of the second columnar portion in the fourth electrode layer.

15. The device according to claim 12, wherein a diameter of a lower end portion of the first columnar portion is smaller than a diameter of an upper end portion of the second columnar portion.

16. The device according to claim 12, wherein each of the first to fourth electrode layers contains silicon and impurity.

17. The device according to claim 16, wherein
a concentration of the impurity in the first electrode layer is higher than a concentration of the impurity in the second electrode layer, and
a concentration of the impurity in the third electrode layer is higher than a concentration of the impurity in the fourth electrode layer.

18. The device according to claim 12, wherein each of the first to the fourth electrode layers contains a metal.

19. The device according to claim 12, further comprising:
a tunnel insulating film provided between the first columnar portion and the first charge storage portion and between the second columnar portion and the second charge storage portion;
a first block insulating film provided between the first electrode layer and the first charge storage portion; and
a second block insulating film provided between the fourth electrode layer and the second charge storage portion.

20. The device according to claim 19, wherein
a first inner diameter of the tunnel insulating film between the first columnar portion and the first charge storage portion is larger than a second inner diameter of the tunnel insulating film
between the second columnar portion and the second charge storage portion.

* * * * *